(12) United States Patent
Okahisa et al.

(10) Patent No.: US 12,113,149 B2
(45) Date of Patent: Oct. 8, 2024

(54) LIGHT SOURCE DEVICE INCLUDING LIGHT SOURCE, LIQUID CRYSTAL SHUTTER, AND LENS

(71) Applicant: NICHIA CORPORATION, Anan (JP)

(72) Inventors: Tsuyoshi Okahisa, Tokushima (JP); Shintaro Noma, Anan (JP)

(73) Assignee: NICHIA CORPORATION, Anan (JP)

(*) Notice: Subject to any disclaimer, the term of this patent is extended or adjusted under 35 U.S.C. 154(b) by 0 days.

(21) Appl. No.: 18/478,941

(22) Filed: Sep. 29, 2023

(65) Prior Publication Data

US 2024/0030378 A1   Jan. 25, 2024

Related U.S. Application Data

(63) Continuation of application No. 17/852,338, filed on Jun. 28, 2022, now Pat. No. 11,810,997.

(30) Foreign Application Priority Data

Jun. 30, 2021 (JP) ................................. 2021-108803

(51) Int. Cl.
*H01L 33/08* (2010.01)
*H01L 33/50* (2010.01)
*H01L 33/58* (2010.01)
*H01L 33/38* (2010.01)

(52) U.S. Cl.
CPC ............ *H01L 33/08* (2013.01); *H01L 33/507* (2013.01); *H01L 33/58* (2013.01); *H01L 33/387* (2013.01)

(58) Field of Classification Search
CPC ....... H01K 33/08; H01K 33/507; H01K 33/58
See application file for complete search history.

(56) References Cited

U.S. PATENT DOCUMENTS

| 9,543,484 B1 | 1/2017 | Endo et al. |
| 11,810,997 B2 * | 11/2023 | Okahisa ................ H01L 33/507 |
| 2007/0262338 A1 | 11/2007 | Higashi et al. |
| 2010/0096965 A1 | 4/2010 | Oyaizu et al. |
| 2011/0297987 A1 | 12/2011 | Koizumi et al. |
| 2013/0001605 A1 | 1/2013 | Ishihara et al. |

(Continued)

FOREIGN PATENT DOCUMENTS

| JP | 2010-139754 A | 6/2010 |
| JP | 2011-258675 A | 12/2011 |

(Continued)

OTHER PUBLICATIONS

Non Final OA in the related U.S. Appl. No. 17/852,338, dated Nov. 9, 2022.

(Continued)

*Primary Examiner* — Joseph L Williams
(74) *Attorney, Agent, or Firm* — Global IP Counselors, LLP

(57) ABSTRACT

A light source device includes a substrate, a light source, a liquid crystal shutter, and a lens. The light source is supported by the substrate. The light source includes a plurality of light emission units two-dimensionally arranged. The liquid crystal shutter is disposed on the light source. The lens is disposed on the liquid crystal shutter. The liquid crystal shutter is configured to perform independent ON/OFF control in two or more regions corresponding to at least one of the light emission units.

13 Claims, 18 Drawing Sheets

(56) References Cited

U.S. PATENT DOCUMENTS

| | | |
|---|---|---|
| 2013/0221389 A1 | 8/2013 | Yamamuro |
| 2017/0005238 A1 | 1/2017 | Hung et al. |
| 2017/0263828 A1 | 9/2017 | Mao et al. |
| 2018/0175239 A1 | 6/2018 | Hayashi |
| 2018/0294388 A1 | 10/2018 | Hung et al. |
| 2019/0221550 A1 | 7/2019 | Harada et al. |
| 2020/0371398 A1 | 11/2020 | Imada et al. |
| 2021/0167263 A1 | 6/2021 | Yamada et al. |
| 2021/0183940 A1 | 6/2021 | van der Sijde et al. |

FOREIGN PATENT DOCUMENTS

| | | |
|---|---|---|
| JP | 2013-016588 A | 1/2013 |
| JP | 2013-175531 A | 9/2013 |
| JP | 2015-076357 A | 4/2015 |
| JP | 2016-115703 A | 6/2016 |
| JP | 2016-219637 A | 12/2016 |
| JP | 2017-055037 A | 3/2017 |
| JP | 2018-139285 A | 9/2018 |
| JP | 2019-125690 A | 7/2019 |
| JP | 2019-175847 A | 10/2019 |
| JP | 2019-220405 A | 12/2019 |
| WO | 2006/035664 A1 | 4/2006 |

OTHER PUBLICATIONS

Final OA in the related U.S. Appl. No. 17/852,338, dated Mar. 13, 2023.

Advisory Action in the related U.S. Appl. No. 17/852,338, dated May 30, 2023.

\* cited by examiner

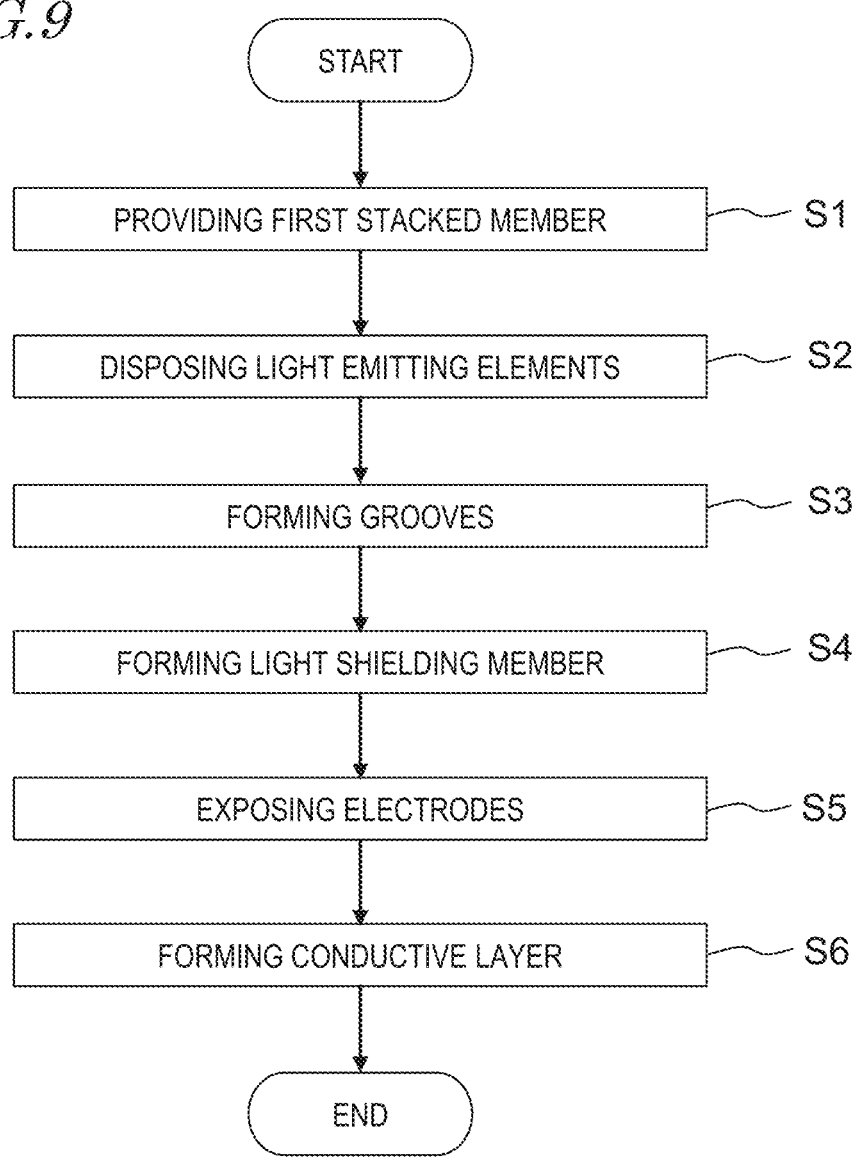

LIGHT SOURCE DEVICE INCLUDING LIGHT SOURCE, LIQUID CRYSTAL SHUTTER, AND LENS

CROSS-REFERENCE TO RELATED APPLICATION

This application is a continuation application of U.S. patent application Ser. No. 17/852,338, filed on Jun. 28, 2022, now U.S. Pat. No. 11,810,997. This application claims priority to Japanese Patent Application No. 2021-108803 filed on Jun. 30, 2021. The entire disclosures of U.S. patent application Ser. No. 17/852,338 and Japanese Patent Application No. 2021-108803 are hereby incorporated herein by reference in its entirety.

BACKGROUND

The present disclosure relates to a light source, a light source device, and a method of manufacturing a light source.

Light sources having a plurality of light emitting elements arranged in an array are utilized in a wide range of application areas. Such light sources can perform partial irradiation with various irradiated areas by driving appropriate one or more of the plurality of light emitting elements. When utilizing such characteristics, a lighting device having features that were unavailable in the past can be realized. For example, Japanese Patent Publication No. 2016-219637 discloses a light source applicable to an automotive adaptive front-lighting system.

SUMMARY

The present disclosure provides a light source having good emission characteristics during partial irradiation, such a light source device, and a method of manufacturing the light source.

A light source according to an embodiment of the present disclosure includes a substrate, a light source, a liquid crystal shutter, and a lens. The light source is supported by the substrate. The light source includes a plurality of light emission units two-dimensionally arranged. The liquid crystal shutter is disposed on the light source. The lens is disposed on the liquid crystal shutter. The liquid crystal shutter is configured to perform independent ON/OFF control in two or more regions corresponding to at least one of the light emission units.

A light source according to another embodiment of the present disclosure includes a plurality of light emitting elements one-dimensionally or two-dimensionally arranged, a plurality of wavelength conversion members, a first light diffusing member, a light transmitting member, a second light diffusing member, and a light shielding member. Each of the light emitting elements has a light emission surface and an electrode surface that is opposite to the light emission surface. Each of the wavelength conversion members is disposed on the light emission surface of a respective one of the light emitting elements. The first light diffusing member is disposed over the wavelength conversion members, continuously covers upper surfaces of the wavelength conversion members, and defines a plurality of grooves each arranged between adjacent ones of regions in a lower surface of the first light diffusing member that are in contact with the wavelength conversion members. The light transmitting member is disposed on the first light diffusing member. The second light diffusing member is disposed on the light transmitting member. The light shielding member covers lateral surfaces of the light emitting elements and lateral surfaces of the wavelength conversion members, and is disposed in the grooves of the first light diffusing member.

A method of manufacturing a light source according to an embodiment of the present disclosure includes: providing a first stacked member which includes a second light diffusing member, a light transmitting member disposed on the second light diffusing member, a first light diffusing member disposed on the light transmitting member, and a wavelength conversion member disposed on the first light diffusing member; one-dimensionally or two-dimensionally disposing a plurality of light emitting elements, each having a light emission surface and an electrode surface that is opposite to the light emission surface, on the wavelength conversion member of the first stacked member such that the light emission surface of each of the light emitting elements faces the wavelength conversion member; forming a plurality of grooves in the first stacked member that divide the wavelength conversion member at positions between the light emitting elements, the grooves reaching the first light diffusing member; forming a light shielding member that fills the grooves and covers lateral surfaces and the electrode surface of each of the light emitting elements; grinding the light shielding member from an upper surface side and exposing a pair of electrodes located on the electrode surface of each of the light emitting elements; and forming on an upper surface of the light shielding member a conductive layer that covers the electrodes that are exposed.

A method of manufacturing a light source according to another embodiment of the present disclosure includes: providing a first stacked member which includes a support, a first light diffusing member disposed on the support, and a wavelength conversion member disposed on the first light diffusing member; one-dimensionally or two-dimensionally disposing a plurality of light emitting elements, each having a light emission surface and an electrode surface that is opposite to the light emission surface, on the wavelength conversion member of the first stacked member such that the light emission surface of each of the light emitting elements faces the wavelength conversion member; forming a plurality of grooves in the first stacked member that divide the wavelength conversion member and the first light diffusing member at positions between the light emitting elements; forming a light shielding member that fills the grooves and covers lateral surfaces and the electrode surface of each of the light emitting elements; grinding the light shielding member from an upper surface side and exposing a pair of electrodes located on the electrode surface of each of the light emitting elements; forming on an upper surface of the light shielding member a conductive layer that covers the electrodes that are exposed; and removing the support and disposing on the first light diffusing member a second stacked member which includes a light transmitting member, and a second light diffusing member disposed on the light transmitting member, or an additional first light diffusing member, the light transmitting member disposed on the additional first light diffusing member, and the second light diffusing member disposed on the light transmitting member.

According to certain embodiments of the present disclosure, a light source having good emission characteristics during partial irradiation, such a light source device, and a method of manufacturing the light source can be provided.

BRIEF DESCRIPTION OF THE DRAWINGS

FIG. 9 is a flowchart of a method of manufacturing a light source according to the first embodiment.

DETAILED DESCRIPTION

Figure 1:
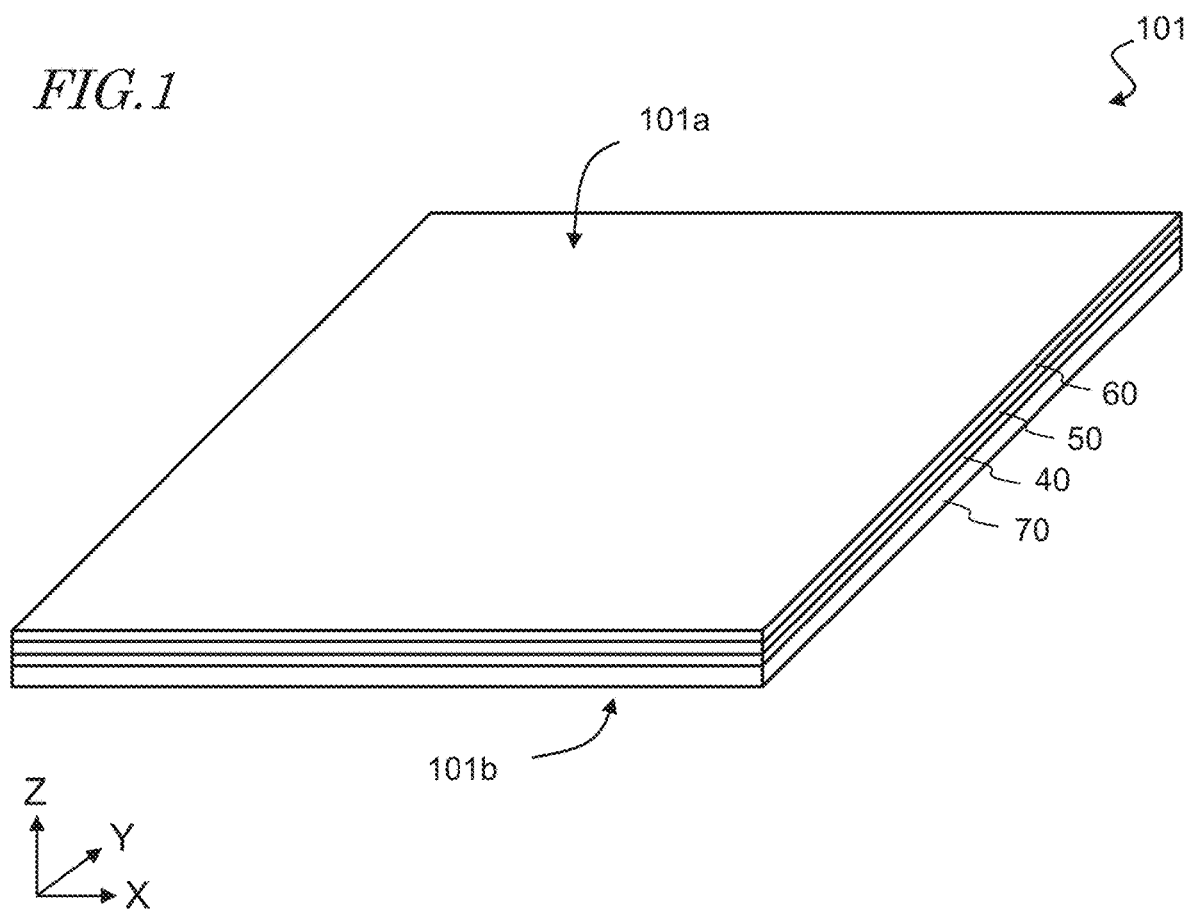
FIG. 1 is a schematic perspective view of a light source according to a first embodiment.

Certain embodiments of the present disclosure will be explained in detail below with reference to the accompanying drawings. The embodiments described below are exemplary, and the light sources and the methods of manufacturing the light sources according to the present disclosure are not limited to those described below. For example, the numerical values, shapes, materials, manufacturing steps, and the sequence of the steps described in the embodiments described below are merely examples, and are modifiable in various ways to the extent that such a modification does not cause technical inconsistencies. Each of the embodiments described below is merely exemplary, and various combinations can be made to the extent that such a combination does not cause technical inconsistencies.

The sizes, shapes, and the like of the constituent elements shown in the drawings might be exaggerated for clarity of explanation, and might not reflect the sizes and shapes of, and the relative sizes among the constituent elements in an actual light source. Illustration of certain elements might be omitted in a drawing or only a cut end surface might be used as a cross-sectional view so as not to make the drawing excessively complex. In the present specification, moreover, the terms such as "cover" and "covering" are not limited to describe cases in which a certain member is directly in contact with another member, and are also used to describe cases in which a certain member indirectly covers another, for example, via another member unless otherwise specifically stated.

In the description below, the constituent elements having practically the same functions are denoted by common reference numerals for which explanation might be omitted. In the description below, terms indicating specific directions or positions (e.g., "upper," "lower," "right," "left" and other terms including or related to these) might be used. These terms, however, are merely used in order to make the relative directions or positions in the drawings being referenced more easily understood. As long as the relationship between relative directions or positions indicated with the terms such as "upper," "lower," or the like is the same as those in a referenced drawing, the layout of the elements in other drawings, or actual products and manufacturing equipment outside of the present disclosure, does not have to be the same as those shown in the referenced drawing. In the present disclosure, being "parallel" includes cases where two straight lines, sides, planes, or the like, form an angle in the range of 0° to about ±5° unless otherwise specifically stated. In the present disclosure, being "perpendicular" or "orthogonal" includes cases where two straight lines, sides, planes, or the like form an angle in the range of from 90° to about ±5° unless otherwise specifically stated. Furthermore, the positional relationships of constituent elements expressed with the term "upper" include cases in which a constituent element is in contact with another, as well as cases in which a constituent element is positioned above another without being in contact.

Numerical value ranges might be expressed using an n-dash or the word "to". For example, "1 mm-5 mm" or "1 mm to 5 mm" means that the value can be 1 mm or larger, but 5 mm at most. In other words, the numerical value range expressed by using an n-dash or the word "to" includes the numerical values before and after the n-dash or the word "to" unless otherwise explicitly stated.

The drawings referenced below include arrows indicating the x, y, and z axes that are orthogonal to one another. The x direction along the x axis represents a predetermined direction in the plane where the light emission units of the light source according to each embodiment are arranged, i.e., the light emission unit arrangement plane, the direction along the y axis is the direction orthogonal to the x direction in the light emission unit arrangement plane, and the z direction along the z axis is the direction orthogonal to the arrangement plane. The x direction pointed by the arrow represents the +x direction, and the direction opposite the +x direction represents the −x direction. The y direction pointed by the arrow represents the +y direction, and the direction opposite the +y direction represents the −y direction. The z direction pointed by the arrow represents the +z direction, and the direction opposite the +z direction represents the −z direction. In each embodiment, the light source, as an example, outputs light in the +z direction. This, however, is not intended to restrict the orientation of the light source or the light source device in use, and the light source and the light source device can be oriented in any way.

First Embodiment

Structure of Light Source 101

Figure 2:
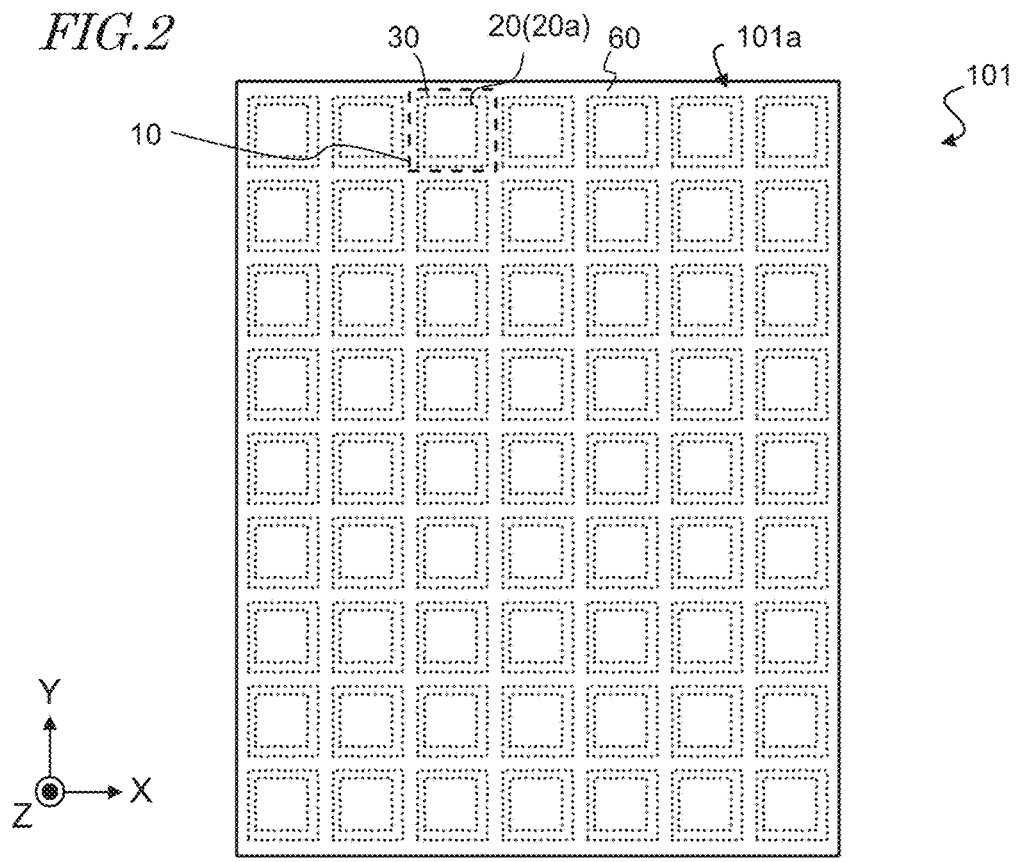
FIG. 2 is a schematic top view of the light source according to the first embodiment.
Figure 3:
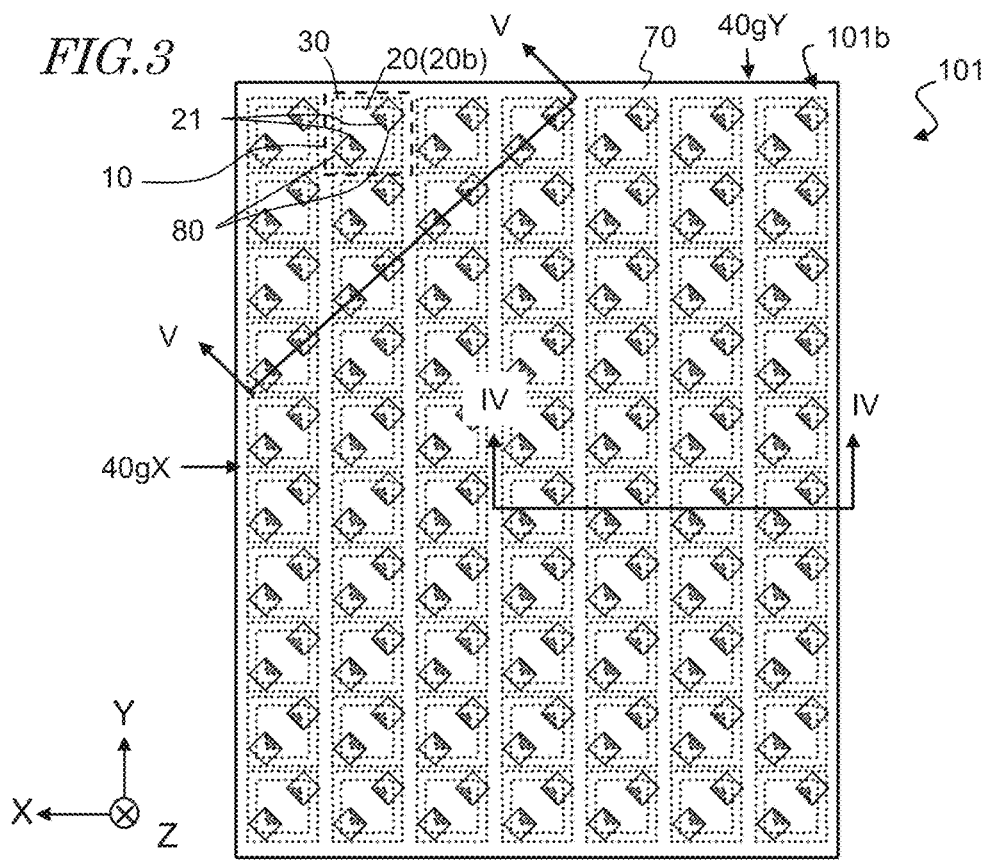
FIG. 3 is a schematic bottom view of the light source according to the first embodiment.
Figure 4:
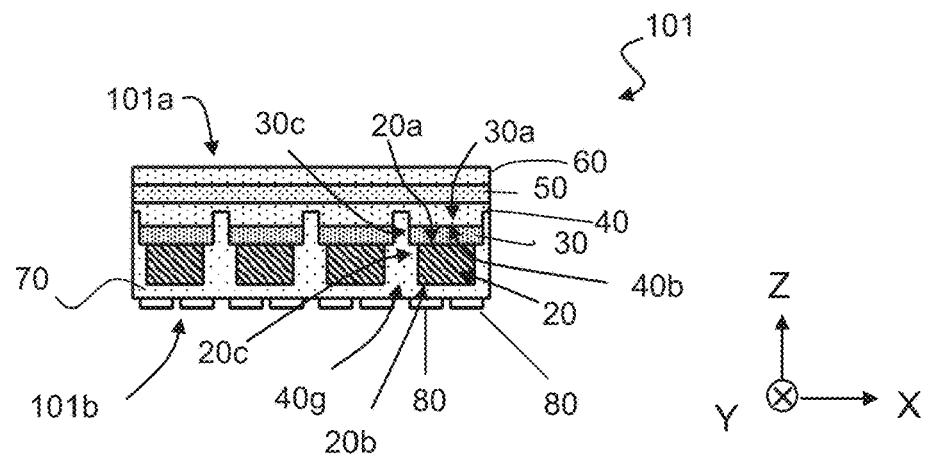
FIG. 4 is a schematic cross-sectional view of the light source according to the first embodiment taken along line IV-IV in FIG. 3.
Figure 5:
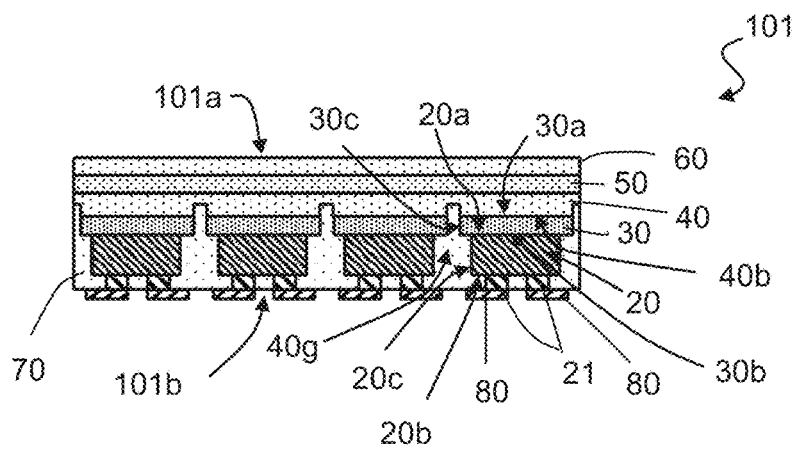
FIG. 5 is a schematic cross-sectional view of the light source according to the first embodiment taken along line V-V in FIG. 3.
Figure 6:
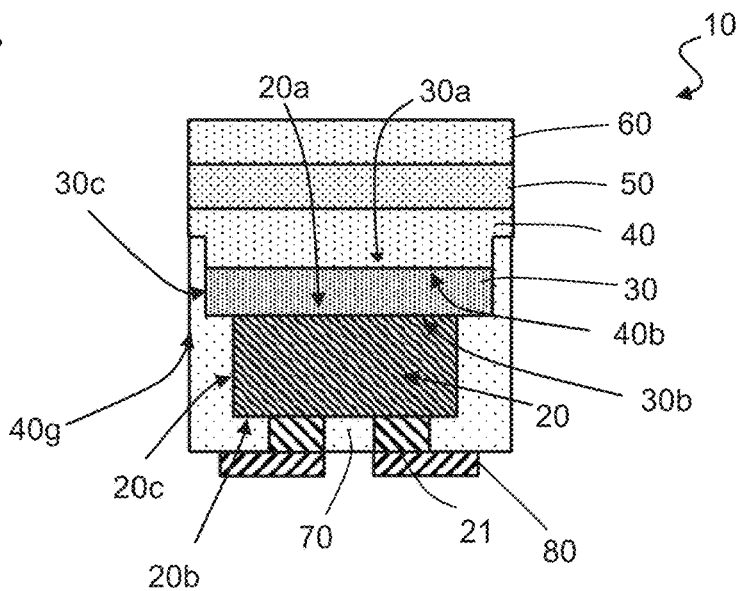
FIG. 6 is a schematic cross-sectional view of a light emission unit.

FIG. 1 is a schematic perspective view of a light source 101 according to a first embodiment, FIG. 2 and FIG. 3 are schematic top and bottom views of the light source 101. In FIG. 2 and FIG. 3, some portions of the internal structure of the light source 101 are indicated using broken lines. FIG. 4 and FIG. 5 are schematic cross-sectional views of the light source 101 taken along lines IV-IV and V-V in FIG. 3, respectively. FIG. 6 is a schematic cross-sectional view of a light emission unit included in the light source 101.

The light source 101 includes a plurality of light emitting elements 20, a plurality of wavelength conversion members 30, a first light diffusing member 40, a light transmitting member 50, a second light diffusing member 60, and a light shielding member 70. As shown in FIG. 2, the light source 101 has a plurality of light emission units 10 which are structural units each including these constituent elements.

In the light source 101, the light emission units 10 are arranged one-dimensionally or two-dimensionally. For example, as shown in FIG. 2, the light emission units 10 are two-dimensionally arranged in the X and Y directions. Because each light emission unit has a light emitting element 20, the light emitting elements 20 are also one-dimensionally or two-dimensionally arranged in the light source 101. In this embodiment, the light source 101 includes 63 light emission units 10, which are arranged in 7 rows and 9 columns in the X and Y directions, respectively. However, a light source 101 can include any number of light emission units 10. The number of light emission units 10 in a light source 101 is, for example, about 9 to 2500, and the light emission units 10 are arranged, for example, in about three rows and three columns to about 50 rows and 50 columns.

A light emission unit 10 has, for example, a square or rectangular shape in a plan view, i.e., in the x-y plane, each side being 50 μm to 550 μm, preferably 200 μm to 450 μm. The light source 101 has, for example, a square or rectangular shape in the x-y plane, each side being 1 mm to 5 mm, preferably 2 mm to 4 mm. The light source 101 is about 100 μm to about 1 mm in thickness, for example. The size and the number of light emission units 10 in a light source 101, and the size of the light source 101 can be determined in accordance with the application. For example, the light source 101 can be used as a flash to capture a still image, or video lighting installed in a mobile device such as a smartphone.

The light source 101 has an upper surface 101a and a lower surface 101b, and a conductive layer 80 for supplying electric current to each light emission unit 10 is disposed on the lower surface 101b. By selectively driving the light emission units 10 using electric current supplied to the light emission units 10 from the outside via the conductive layer 80, light is output primarily from the upper surface 101a.

As shown in FIG. 4 and FIG. 5, in the light source 101, the wavelength conversion members 30 are individually disposed on the light emission surfaces 20a of the light emitting elements 20. The first light diffusing member 40 continuously covers the upper surfaces 30a of the wavelength conversion members 30. The light transmitting member 50 is disposed on the first light diffusing member 40, and the second light diffusing member 60 is disposed on the light transmitting member 50. As described later, the first light diffusing member 40 has grooves 40g in the lower surface 40b that divide the lower surface 40b into multiple regions. The regions in the lower surface 40b defined by the grooves 40g are individually in contact with the wavelength conversion members 30. The light shielding member 70 covers the lateral surfaces 20c of the light emitting elements 20 and the lateral surfaces 30c of the wavelength conversion members 30. The light shielding member 70 is also disposed in the grooves 40g of the first light diffusing member 40. The structure of the light source 101 will be explained in more detail by describing each constituent element.

Light Emitting Element 20

A light emitting element 20 has a light emission surface 20a, an electrode surface 20b positioned opposite the light emission surface 20a, and lateral surfaces 20c between the light emitting surface 20a and the electrode surface 20b. On the electrode surface 20b, at least a pair of positive and negative electrodes 21 are positioned.

The light emitting element 20 is a semiconductor light emitting element, such as a laser diode (LD), light emitting diode (LED), or the like. The light emitting element 20 is typically an LED. The light emitting element 20 includes, for example, a sapphire or gallium nitride support substrate, and a semiconductor stacked body on the support substrate. The semiconductor stacked body includes an n-type semiconductor layer, a p-type semiconductor layer, an active layer interposed between these two layers, and p-side and n-side electrodes electrically connected to the n-type and p-type semiconductor layers. The semiconductor stacked body may include a nitride semiconductor ($In_xAl_yGa_{1-x-y}N$, $0 \leq x$, $0 \leq y$, $x+y \leq 1$) capable of emitting light in the ultraviolet to visible spectra. The positive and negative electrodes 21 are electrically connected to the p-side and the n-side electrodes.

The light emitting element 20 may be a blue light emitting element, or a light emitting element emitting light of another color, such as red, green, or ultraviolet. In this embodiment, a blue light emitting LED is illustrated as the light emitting element 20 in each light emission unit 10.

Figure 7:
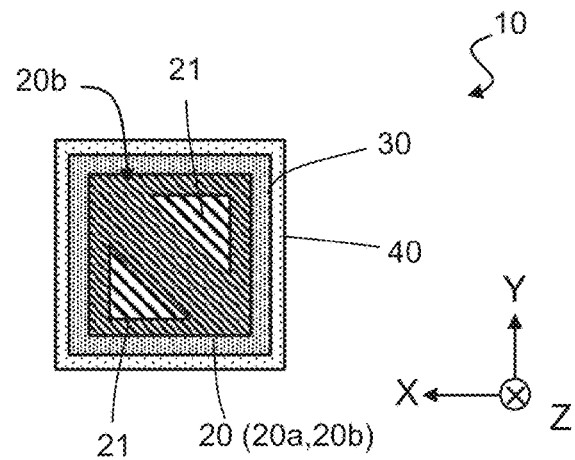
FIG. 7 is a schematic bottom view of the light emission unit from which the conductive layer and the light shielding member are removed.

FIG. 7 is a plan view of a light emission unit 10 when viewed from the electrode surface 20b side of the light emitting element 20 from which the light shielding member 70 and the conductive layer 80 are removed. For clarity of explanation, the same pattern is applied to each constituent element as that used in the cross section shown in FIG. 6.

A plan view shape of a light emitting element 20, i.e., the light emission surface 20a or the electrode surface 20b, is typically quadrangular. The length of a side of the quadrangular light emission surface 20a is preferably smaller than the length of the corresponding side of the light emission unit 10 in a top view. For example, a light emitting element 20 has a square or rectangular shape in which the length of a side is 40 µm to 500 µm, preferably 100 µm to 350 µm.

Each side of the quadrangles of the light emission surface 20a and the electrode surface 20b parallels the X or Y direction along which the light emission units 10 and the light emitting elements 20 are arranged. The electrodes 21 are arranged in a diagonal direction of the quadrangle. In the present embodiment, in a plan view, the electrodes 21 have triangular shapes. When arranging a pair of electrodes in a diagonal direction, a triangular shape is beneficial as it can minimize the distance between the pair of electrodes while increasing the area of each electrode. The triangular shape may be such that the corners are rounded, or a portion of a side includes a curved line. Here, the electrodes 21, as shown in FIG. 7, are substantially right triangles, and the right angles of the right triangles are positioned diagonally in the quadrangular shape of the electrode surface 20b. As shown in FIG. 4, the electrodes 21 are absent in a cross section taken along the line that passes the plan view centers of the light emitting elements 20 and in parallel with the X and Z directions.

Wavelength Conversion Member 30

A wavelength conversion member 30 is disposed on the light emission surface 20a of each light emitting element 20. The wavelength conversion member 30 absorbs a portion of the light exiting the light emission surface 20a of the light emitting element 20 and emits light having a longer wavelength than that of the absorbed light.

As shown in FIG. 2, in a plan view, the wavelength conversion member 30 is preferably larger than the light emission surface 20a of a light emitting element 20. This allows a larger area than the light emission surface 20a of the light emitting element 20 to output light of a desired color (e.g., white light). This can reduce the generation of low luminance regions between the light emission units 10 when multiple light emission units 10 are lit, even in the case in which the light emitting elements 20 cannot be arranged at sufficiently small intervals in the light source 101.

The plan view shape of a wavelength conversion member 30 is typically quadrangular. The length of a side of the quadrangular wavelength conversion member 30 is preferably 45 µm to 525 µm, preferably 150 µm to 400 µm. In a plan view, the wavelength conversion member 30 has, for example, an area that is at least 50%, more preferably at least 90% larger than the area of the light emission surface of a light emitting element 20. The distance between adjacent wavelength conversion members 30 is, for example, 10 µm to 100 µm. The wavelength conversion member 30 is preferably a sheet or layer shaped member. The thickness of the wavelength conversion member 30 can be set, for example, as 30 µm to 100 µm.

The wavelength conversion member in a plan view has, for example, a quadrangular shape. In other words, the upper surface 30a and the lower surface 30b are quadrangular defined by four sides that parallel the X or Y direction. As shown in FIG. 7, when viewed from the electrode surface 20b side of the light emitting element 20, a portion of the lower surface 30b of the wavelength conversion member 30 does not oppose the light emission surface 20a of the light emitting element 20, but is exposed while surrounding the light emission surface 20a.

The wavelength conversion member 30 includes, for example, a light transmissive resin and a phosphor contained in the light transmissive resin. For the phosphor, for example, yttrium aluminum garnet based phosphors (e.g., $Y_3(Al,Ga)_5O_{12}:Ce$), lutetium aluminum garnet based phosphors (e.g., $Lu_3(Al,Ga)_5O_{12}:Ce$), terbium aluminum garnet based phosphors (e.g., $Tb_3(Al,Ga)_5O_{12}:Ce$), CCA-based phosphors (e.g., $Ca_{10}(PO_4)_6Cl_2:Eu$), SAE-based phosphors (e.g., $Sr_4Al_{14}O_{25}:Eu$), chlorosilicate based phosphors (e.g., $Ca_8MgSi_4O_{16}Cl_2:Eu$), nitride based phosphors, such as β-SiAlON based phosphors (e.g., $(Si,Al)_3(O,N)_4:Eu$), α-SiAlON based phosphors (e.g., $Ca(Si,Al)_{12}(O,N)_{16}:Eu$), SLA based phosphors (e.g., $SrLiAl_3N_4:Eu$), CASN-based phosphors (e.g., $CaAlSiN_3:Eu$), or SCASN-based phosphors (e.g., $(Sr,Ca)AlSiN_3:Eu$), fluoride based phosphors, such as KSF-based phosphors (e.g., $K_2SiF_6:Mn$), KSAF-based phosphors (e.g., $K_2(Si,Al)F_6:Mn$), or MGF-based phosphors (e.g., $3.5MgO \cdot 0.5MgF_2 \cdot GeO_2:Mn$), phosphors having a Perovskite structure (e.g., $CsPb(F,Cl,Br,I)_3$), or quantum dot phosphors (e.g., CdSe, InP, $AgInS_2$ or $AgInSe_2$) can be used.

KSAF-based phosphors can have a composition represented by the formula (I) below:

$$M_2[Si_pAl_qMn_rF_s] \quad (I)$$

In the formula (I), M represents an alkali metal, and may include at least K. Mn can be tetravalent Mn ions. P, q, r, and s can satisfy $0.9 \leq p+q+r \leq 1.1$, $0 < q \leq 0.1$, $0 < r \leq 0.2$, and $5.9 \leq s \leq 6.1$, preferably, $0.95 \leq p+q+r \leq 1.05$ or $0.97 \leq p+q+r \leq 1.03$, $0 < q \leq 0.03$, $0.002 \leq q \leq 0.02$ or $0.003 \leq q \leq 0.015$, $0.005 \leq r \leq 0.15$ or $0.01 \leq r \leq 0.12$ or $0.015 \leq r \leq 0.1$, $5.92 \leq s \leq 6.05$ or $5.95 \leq s \leq 6.025$.

Examples include the compositions represented by $K_2[Si_{0.946}Al_{0.005}Mn_{0.049}F_{5.995}]$,  $K_2[Si_{0.942}Al_{0.008}Mn_{0.050}F_{5.992}]$ and $K_2[Si_{0.939}Al_{0.014}Mn_{0.047}F_{5.986}]$. Such KSAF-based phosphors can emit high luminance red light having a peak emission wavelength with a narrow full width at half maximum.

For the light transmissive resin, a silicone resin, modified silicone resin, epoxy resin, modified epoxy resin, acrylic resin, or fluorine resin can be used. Mixtures of these resins may alternatively be used.

The wavelength conversion members 30 may include several types of phosphors, for example, a phosphor that absorbs blue light and emits yellow light and a phosphor that absorbs blue light and emits red light. Adjusting the types and contents of the phosphors in the wavelength conversion members 30 allows the light emission units 10 to emit light of a desired color.

The wavelength conversion members 30 may contain a light diffusing material to the extent that it does not block light. The light diffusing material content in the wavelength conversion members 30 can be adjusted such that the transmittance of the wavelength conversion members 30 with respect to the light exiting the light emitting elements 20 and/or the wavelength-converted light is 50% to 99%, preferably 70% to 90%. For the light diffusing material, for example, titanium oxide, silicon oxide, aluminum oxide, zinc oxide, or glass can be used.

For the wavelength conversion members 30, glass containing a phosphor may be used. Alternatively, the wavelength conversion members may be a sintered body composed only of a phosphor, or a sintered body which includes a phosphor and any of the light diffusing materials described above.

First Light Diffusing Member 40

A first light diffusing member 40 is disposed on the wavelength conversion members 30 so as to continuously cover the upper surfaces 30a of the wavelength conversion members 30. The first light diffusing member 40 randomly changes the direction of travel of the incident light before the light exits. In other words, the incident light is diffused by the first light diffusing member 40 while passing therethrough. The first light diffusing member 40 has a plurality of grooves 40g in the lower surface 40b which opposes the wavelength conversion members 30. The grooves 40g are formed between the regions of the lower surface 40b that are in contact with the wavelength conversion members 30. The grooves 40g include grooves 40gX parallel to the X direction and grooves 40gY parallel to the Y direction. As described later, a light shielding member 70 is disposed in the grooves 40g. In the example shown in FIG. 4 to FIG. 6, the grooves 40g do not reach the upper surface 40a of the first light diffusing member 40. Accordingly, even though the grooves 40g define multiple regions in the lower surface 40b of the first light diffusing member 40 that are in contact with the wavelength conversion members 30, the first light diffusing member 40 is a single undivided continuous member. The shape of each region of the lower surface 40b of the first light diffusing member 40 defined by the grooves 40g is preferably one that can enclose the upper surface of a wavelength conversion member 30, and preferably has roughly the same shape as that of the wavelength conversion member 30 in a plan view. This can reduce color deviations which tend to occur along the perimeters of the wavelength conversion members 30.

The grooves 40g may reach the upper surface 40a of the first light diffusing member 40. In other words, the first light diffusing member 40 may be divided by the grooves 40g into multiple first light diffusing members 40, and the lower surface sectioned into multiple regions by the grooves 40g. In this case, the first light diffusing members 40 are individually disposed on the wavelength conversion members 30.

The first light diffusing member 40 includes, for example, a light transmissive resin, and a light diffusing material contained in the light transmissive resin. For the light transmissive resin and the light diffusing material, a light transmissive resin and a light diffusing material similar to those used for the wavelength conversion members 30 can be used.

The first light diffusing member 40 may have, for example, a total transmittance (Tr) of 30% to 99% and a diffusion rate (D) of 10% to 90%. The higher the diffusion rate (D), the more preferable it is for reducing the generation of dark lines between the units.

However, the greater the diffusion rate, the greater the optical loss results. Accordingly, the diffusion rate of the first light diffusing member 40 can be appropriately adjusted by adjusting the size of each member that constitutes the units. The thickness of the first light diffusing member 40 is, for example, 10 μm to 100 μm. The depths of the grooves 40g are preferably substantially the same across the entire area, but the depths may vary in part. The depths of the grooves 40g are preferably set, for example, as 50% to 100% of the thickness of the first light diffusing member 40. This can reduce the diffusion of the light from one of two adjacent light emission units 10 that is lit into the other unlit light emission unit. The widths of the grooves 40g in a plan view may be substantially the same across the entire area, or vary in part. The widths of the grooves 40g are, for example, 5 μm to 100 μm. The widths of the grooves 40g are preferably substantially constant in the direction of depth, but may gradually or sharply broaden or narrow in the direction of depth.

Light Transmitting Member 50

A light transmitting member 50 is disposed on the first light diffusing member 40. As described later, the light transmitting member 50 guides the incident light from the light emitting elements 20 into the second light diffusing member 60 and can also propagate the light in the lateral direction (direction substantially parallel to the XY plane which passes the X axis and the Y axis) to thereby reduce the generation of dark portions between the wavelength conversion members 30. In the case in which the first light diffusing member 40 is divided into multiple first light diffusing members 40 by the grooves 40g, the light transmitting member 50 is placed on the first light diffusing members 40 while continuously covering the first light diffusing members 40.

The light transmitting member 50 can be composed of a resin similar to the light transmissive resin used for the wavelength conversion members 30. The light transmitting member 50 may be made of glass, light transmissive ceramics, or the like. From the standpoint of increasing the strength of the light source 101, the light transmitting member 50 is preferably a glass sheet, ceramic sheet, or the like. The thickness of the light transmitting member 50 is, for example, about 50 μm to about 300 μm. The thickness of the light transmitting member 50 may be larger than the thickness of the second light diffusing member 60 described later. Satisfying such a relationship can increase the lateral propagation of light, which allows for reducing the dark portions between the wavelength conversion members 30. The light transmitting member 50 has, for example, a total transmittance of 80% to 99%. The light transmitting member 50 may contain a light diffusing material so long as it has the total transmittance described above, but preferably contains practically no light diffusing material.

Second Light Diffusing Member 60

A second light diffusing member 60 is disposed on the light transmitting member 50. The second light diffusing member 60 randomly changes the direction of travel of the incident light before the light exits. In other words, the incident light is diffused by the second light diffusing member 60 while passing therethrough. Diffusion can weaken the directivity of light, and thus can increase the contrast between a lit light emission unit 10 and an unlit light emission unit 10 as described later.

The second light diffusing member 60 can be composed of similar materials to those used for the first light diffusing member 40. The second light diffusing member 60 has, for example, a total transmittance (Tr) of 30% to 99% and a diffusion rate (D) of 10% to 90%. The thickness of the second light diffusing member 60 is, for example, 10 μm to 100 μm.

Light Shielding Member 70

A light shielding member 70 covers the lateral surfaces 20c of the light emitting elements 20 and the lateral surfaces 30c of the wavelength conversion members 30. The light shielding member 70 is also disposed in the grooves 40g of the first light diffusing member 40. In this embodiment, the light shielding member 70 is also disposed in the regions of the electrode surfaces 20b of the light emitting elements 20 excluding the electrodes 21. Each wavelength conversion member 30 is larger than the light emission surface 20a of a light emitting element 20, so that the region of the lower surface 30b of the wavelength conversion member 30 not in contact with the light emission surface 20a is also covered by the light shielding member 70. The light shielding member 70 is continuously disposed between the light emitting elements 20 and between the wavelength conversion members 30, forming the lower surface 101b of the light source 101 as a whole.

The light shielding member 70 is a member that has light reflectivity and/or light absorbing properties. By covering at least the lateral surfaces 20c of the light emitting elements 20 and the lateral surfaces 30c of the wavelength conversion members 30, the light shielding member 70 hinders the light that exits the lateral surfaces 20c of the light emitting element 20 and the lateral surfaces 30c of the wavelength conversion member 30 of each light emission unit 10 from entering any adjacent light emission unit 10.

The light shielding member 70 preferably has high reflectivity which allows the light exiting the lateral surfaces of the light emitting elements 20 to be reflected and extracted. This can produce a higher light extraction efficiency light source. The light shielding member 70 preferably has, for example, at least 60%, more preferably at least 90% reflectivity with respect to the outgoing light from the light emitting elements 20. The light shielding member 70 includes, for example, a light transmissive resin and a light diffusing material contained in the light transmissive resin. For the light transmissive resin and the light diffusing material, similar materials to those used for the wavelength conversion members 30 can be used. The light shielding member may contain a light absorbing material such as carbon black in addition to the light diffusing material.

Conductive Layer 80

A conductive layer 80 is a terminal for supplying an electric current form the outside to the light emitting elements 20 in the light emission units of the light source 101. As shown in FIG. 3, the conductive layer 80 is disposed at multiple locations on the surface of the light shielding member 70 on the electrode surface side of the light emitting elements 20 which is the lower surface 101b of the light source 101. A portion of the conductive layer 80 at each location covers an electrode 21, and is electrically connected to the electrode 21. The lower surface of an electrode 21 exposed from the light shielding member 70 is preferably entirely covered by the conductive layer 80. This can achieve the stability in the electrical connection between the electrode 21 and the conductive layer 80. Another portion of the conductive layer 80 at each location is positioned on the light shielding member 70 which makes up the lower surface 101b. In each light emission unit 10, a pair of pieces of the conductive layer 80 is disposed in a diagonal direction of the quadrangular shaped light emitting element 20. In a plan view, the conductive layer 80 at each location has a quadrangular shape, one side of which is along the hypotenuse of a right triangle shaped electrode 21. The pieces of the conductive layer 80 of such shapes are two-dimensionally arranged in the directions resulting from rotating 45 degrees the X and Y directions along which the light emitting elements 20 are arranged. The arrangement pitch of the light emitting elements 20 in a diagonal direction, i.e., the direction resulting from turning the X or Y direction 45 degrees, is the value obtained by the pitch in the X or Y direction times the square root of 2. This is beneficial in terms of making it easier to secure the distance between the pieces of the conductive layer 80 while increasing the area of each piece of conductive layer 80 even when the light emitting elements 20 are highly densely mounted.

The conductive layer 80 is composed, for example, of a single layer or a plurality of layers of metals, such as Ag, Al, Au, Cu, Ti, Ni, Pt, Pd, W, or the like.

Operation of Light Source 101

The operation of a light source 101 will be explained with reference to FIG. 8. In the light source 101, the light exiting the light emission surfaces 20a of the light emitting elements 20 passes through the wavelength conversion members 30, the first light diffusing member 40, the light transmitting member 50, and the second light diffusing member 60 before exiting the light source. At this time, the wavelength of at least a portion of the light from the light emitting elements 20 is converted by the wavelength conversion members 30. The light externally output includes the light which has exited the light emitting elements 20 and the wavelength-converted light. For example, in the case in which the light emitting elements 20 emit blue light and the wavelength conversion members 30 contain at least a yellow-emitting phosphor, the light source 101 emits white light resulting from mixing the blue light and the yellow light.

The light source 101 structured as above has good emission characteristics during partial irradiation. Specifically, the wavelength conversion members 30 are larger than the light emission surfaces 20a of the light emitting elements 20 in a top view, so that the light source can emit white light through larger areas than the light emission surfaces 20a of the light emitting elements 20. This increases the proportions of the emission regions in the upper surface 101a which can reduce the size of a non-emission region E1 between two adjacent emission regions. Accordingly, when two adjacent light emission units 10 are lit, the generation of a low luminance region between the two can be reduced.

As described above, because the wavelength conversion members 30 are larger than the light emission surfaces 20a of the light emitting element 20, the wavelength conversion member 30 in each light emission unit 10 is closely located to the wavelength conversion members 30 in adjacent light emission units 10. This allows the light exiting a lateral surface 30c of a wavelength conversion member 30c indicated by the arrow E2 to readily enter the lateral surface 30c of an adjacent wavelength conversion member 30. The light shielding member 70 which covers the lateral surfaces of the wavelength conversion members 30 can limit the propagation of light between such adjacent wavelength conversion members 30, thereby reducing the leakage of light along the boundary between a lit light emission unit 10 and an unlit light emission unit 10 as well as reducing the pseudo lighting of the adjacent light emission unit 10 caused by such leakage.

The color of the light exiting outward from the optical axis of a light emitting element 20 indicated by the arrow E3 tends to shift towards yellow because the distance of travel through the wavelength conversion member 30 is relatively long. Such a shift in the color towards yellow tends to occur along the periphery of the emission region in a lit light emission unit 10. Disposing a first light diffusing member 40 on the wavelength conversion members 30 can reduce such a shift in the color towards yellow along the periphery of an emission region (yellow ring), thereby reducing emission color non-uniformity within the emission region. Furthermore, disposing a light shielding member 70 in the grooves 40g of the first light diffusing member 40 can hinder such color-shifted light from laterally spreading.

The light transmitting member 50 is a light guide that parallels the XY plane, the arrangement directions of the light emission units 10, and can laterally propagate the outgoing light from the light emitting element 20 in a lit light emission unit 10 that becomes incident on the light transmitting member 50 as indicated by the arrow E4. This can reduce the luminance decline in the non-emission region E1 between two adjacent emission regions. Moreover, the light transmitting member 50 is spaced apart from the wavelength conversion members 30 by the first light diffusing member 40. This can hinder the light indicated by the arrow E4 from entering the wavelength conversion members 30 while being reflected inside the light transmitting member 50, which would otherwise cause further wavelength conversion resulting in color deviations. Furthermore, the light transmitting member 50 spaces the first light diffusing member 40 apart from the second light diffusing member 60, allowing the first light diffusing member 40 and the second light diffusing member 60 to have different optical functions.

The light diagonally exiting the light transmitting member 50 indicated by the arrow E5 becomes incident on the second light diffusing member 60 and is diffused. This weakens the directivity of the light indicated by the arrow E5. In the case in which an adjacent light emission unit 10 is unlit, the leakage of light from the lit light emission unit 10 into the adjacent unlit light emission unit 10 can be reduced.

This can increase the contrast between the emission region and the non-emission region in the upper surface 101a.

Figure 8:
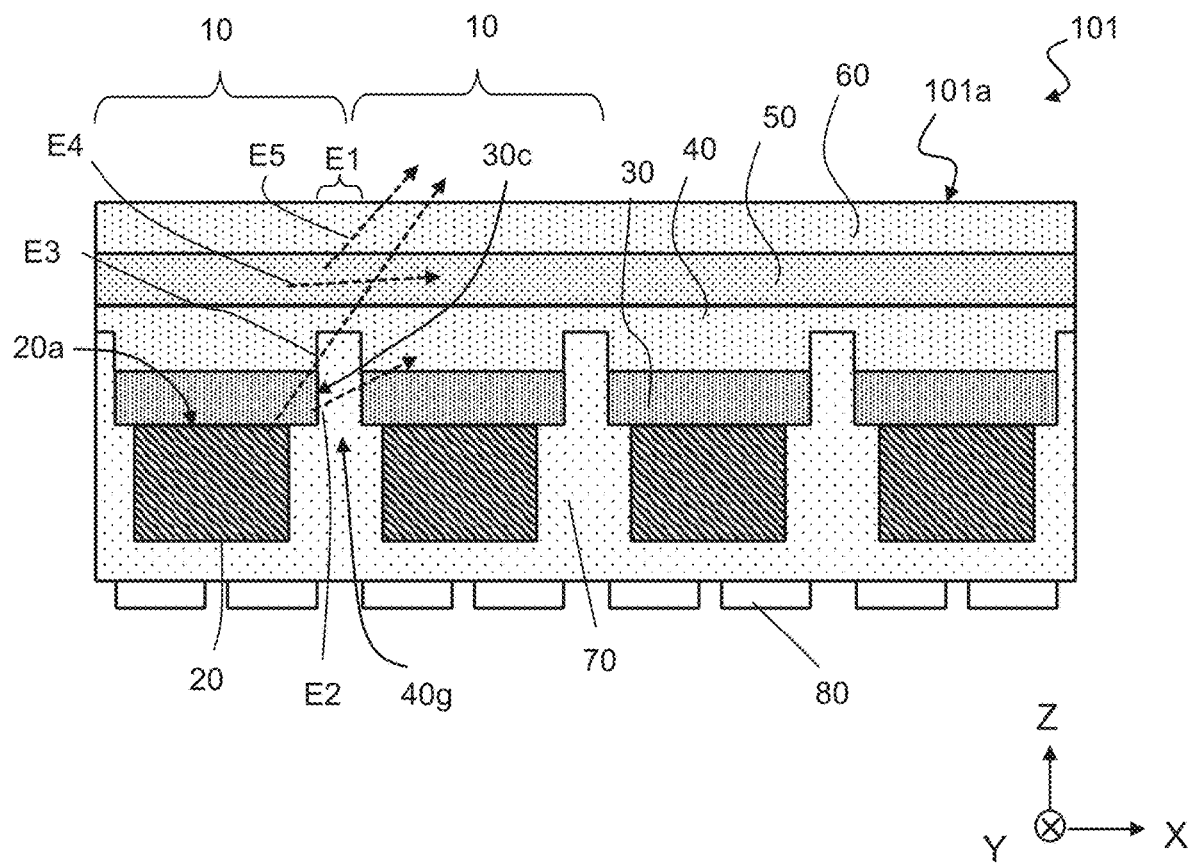
FIG. 8 is a schematic perspective view explaining the operation of the light source according to the first embodiment.

The arrows E2, E3, E4, and E5 in FIG. 8 are schematic representation of the directions of exiting of light. The direction of travel of the light actually exits a light emitting element might change as it passes through each member depending on the refractive index difference between the members at each interface.

Light Source 101 Manufacturing Method 1

A method of manufacturing a light source 101 according to an embodiment will be explained. FIG. 9 is a flowchart showing an example of the method of manufacturing a light source 101, and FIGS. 10A to 10F are cross-sectional views each showing a process in the method of manufacturing a light source 101. FIG. 10A to FIG. 10F are cross sections taken along line V-V in FIG. 3 for clarity purpose. The method of manufacturing the light source 101 according to this embodiment includes a first stacked member provision step (S1), a light emitting element disposing step (S2), a groove forming step (S3), a light shielding member forming step (S4), an electrode exposing step (S5), and a conductive layer forming step (S6).

Stacked Member Provision Step (S1)

Figure 10A:
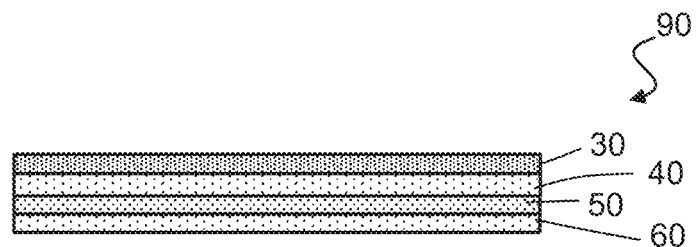
FIG. 10A is a cross-sectional view of a process in the method of manufacturing a light source according to the first embodiment.

As shown in FIG. 10A, a stacked member 90, which includes a second light diffusing member 60, a light transmitting member 50 disposed on the second light diffusing member 60, a first light diffusing member 40 disposed on the light transmitting member 50, and a wavelength conversion member 30 disposed on the first light diffusing member 40, is provided.

For example, the stacked member 90 is formed by adhering the members together using an adhesive, or an adhesive sheet. The stacked member 90 may have a size corresponding to a single light source 101 or to form multiple light sources 101. The stacked member 90 may be formed by stacking the members in sequence starting with a second light diffusing member 60, or by providing a stacked body adhering a wavelength conversion member 30 and a first light diffusing member 40, a stacked body adhering a light transmitting member 50 and a second light diffusing member 60 and adhering the two stacked bodies. Alternatively, the stacked member 90 may be provided by obtaining a stacked member 90 that has been separately formed.

Light Emitting Element Disposing Step (S2)

Figure 10B:
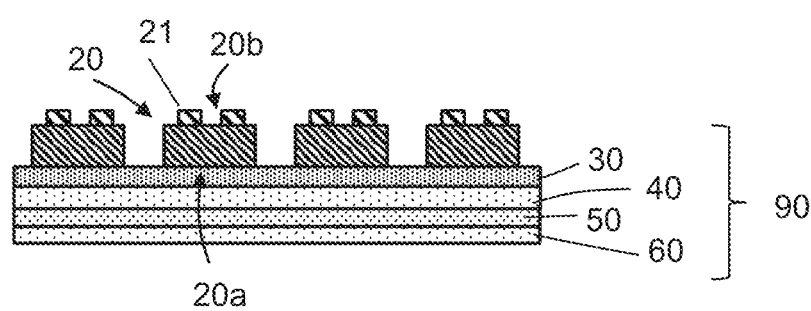
FIG. 10B is a cross-sectional view of a process in the method of manufacturing a light source according to the first embodiment.

As shown in FIG. 10B, on the wavelength conversion member 30 of the stacked member 90, a plurality of light emitting elements 20 each having a light emission surface 20a and an electrode surface 20b positioned opposite the light emission surface 20a are one-dimensionally or two-dimensionally arranged such that the light emission surfaces 20a oppose the wavelength conversion member 30.

The light emitting elements 20 are arranged such that the light emission surfaces 20a faces the wavelength conversion member 30, and the light emitting elements 20 are bonded to the wavelength conversion member 30. The light emitting elements can be bonded via a light transmissive bonding material, such as an adhesive or adhesive sheet, which is applied beforehand to the surface of the wavelength conversion member 30 or the light emission surfaces 20a of the light emitting elements 20. The light emitting elements 20 are one-dimensionally or two-dimensionally arranged using the arrangement pitch for the light emission units 10 in a light source 101. The light emitting elements 20 and the wavelength conversion member 30 may be directly bonded without any bonding material by utilizing the tackiness of the wavelength conversion member 30.

Groove Forming Step (S3)

Figure 10C:
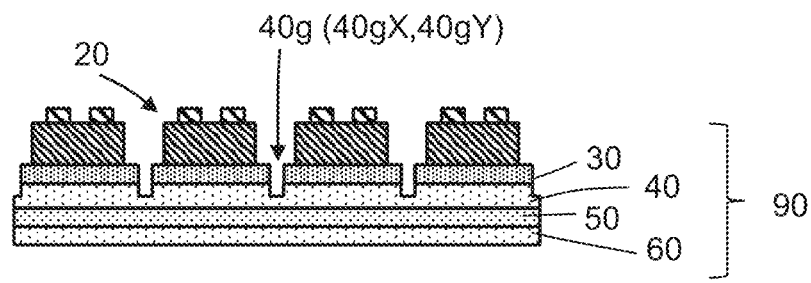
FIG. 10C is a cross-sectional view of a process in the method of manufacturing a light source according to the first embodiment.

As shown in FIG. 10C, grooves 40g each dividing the wavelength conversion member 30 between two adjacent light emitting elements 20 and reaching the first light diffusing member 40 are formed in the stacked member 90. The grooves 40g include grooves 40gX parallel to the X direction and grooves 40gY parallel to the Y direction. The grooves 40g are formed in the stacked member 90 from the wavelength conversion member 30 side between two adjacent light emitting elements 20 by using a blade such as a dicing saw. The depths of the grooves 40g are set to be larger than the thickness of the wavelength conversion member 30, but equal to or less than the sum of the thicknesses of the wavelength conversion member 30 and the first light diffusing member 40. This divides the wavelength conversion member 30 while forming the grooves 40g in the first light diffusing member 40. In this manner, the divided wavelength conversion members 30 can be individually disposed on respective light emitting elements 20.

Light Shielding Member Forming Step (S4)

Figure 10D:
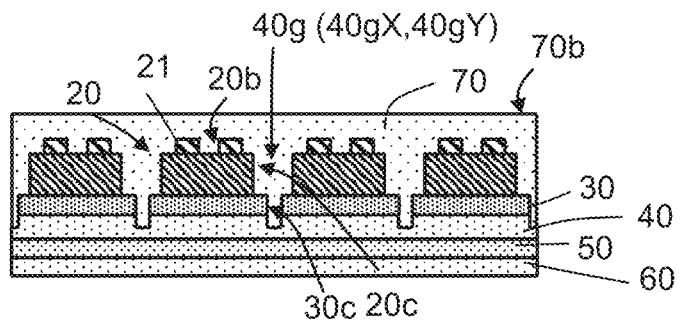
FIG. 10D is a cross-sectional view of a process in the method of manufacturing a light source according to the first embodiment.

As shown in FIG. 10D, a light shielding member 70 disposed in the grooves 40g and covering the lateral surfaces 20c and the electrode surfaces 20b of the light emitting elements 20 is formed. Specifically, the light shielding member 70 is formed by disposing and hardening an uncured light shielding material in the grooves 40g so as to cover the lateral surfaces 20c, the electrodes 21, and the electrode surfaces 20b of the light emitting elements 20. The light shielding member 70 can be formed, for example, by transfer molding, potting, printing, spraying or the like.

Electrode Exposing Step (S5)

Figure 10E:
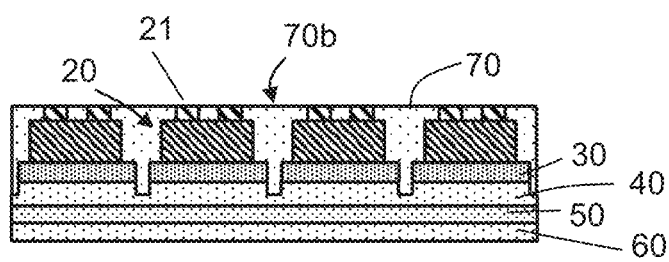
FIG. 10E is a cross-sectional view of a process in the method of manufacturing a light source according to the first embodiment.

As shown in FIG. 10E, the light shielding member 70 is ground to expose the positive and negative electrodes 21 located on the electrode surfaces 20b of the light emitting elements 20. Specifically, the surfaces of the electrodes of the light emitting elements 20 are exposed from the light shielding member 70 by grinding or polishing a portion of the light shielding member 70 from the upper surface 70b of the light shielding member 70.

Conductive Layer Forming Step (S6)

Figure 10F:
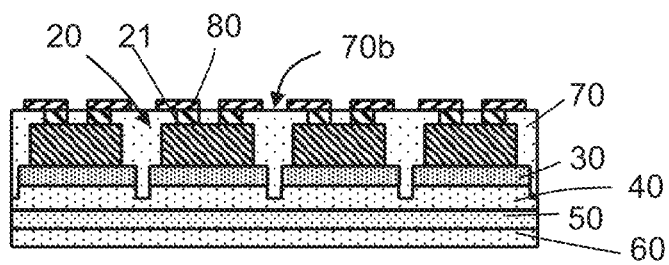
FIG. 10F is a cross-sectional view of a process in the method of manufacturing a light source according to the first embodiment.

As shown in FIG. 10F, a conductive layer 80 that covers the exposed positive and negative electrodes 21 is formed on the upper surface of 70b of the light shielding member 70. For example, one or more metal layers are formed across the entire upper surface 70b of the light shielding member 70 while covering the electrodes 21. Subsequently, portions of the metal layer(s) covering the light shielding member 70 are removed by etching or the like to form the pieces of conductive layer 80 each partly covering an electrode 21 while partly covering the upper surface 70b of the light shielding member 70. Thus, a light source 101 can be obtained.

Light Source 101 Manufacturing Method 2

Figure 11:
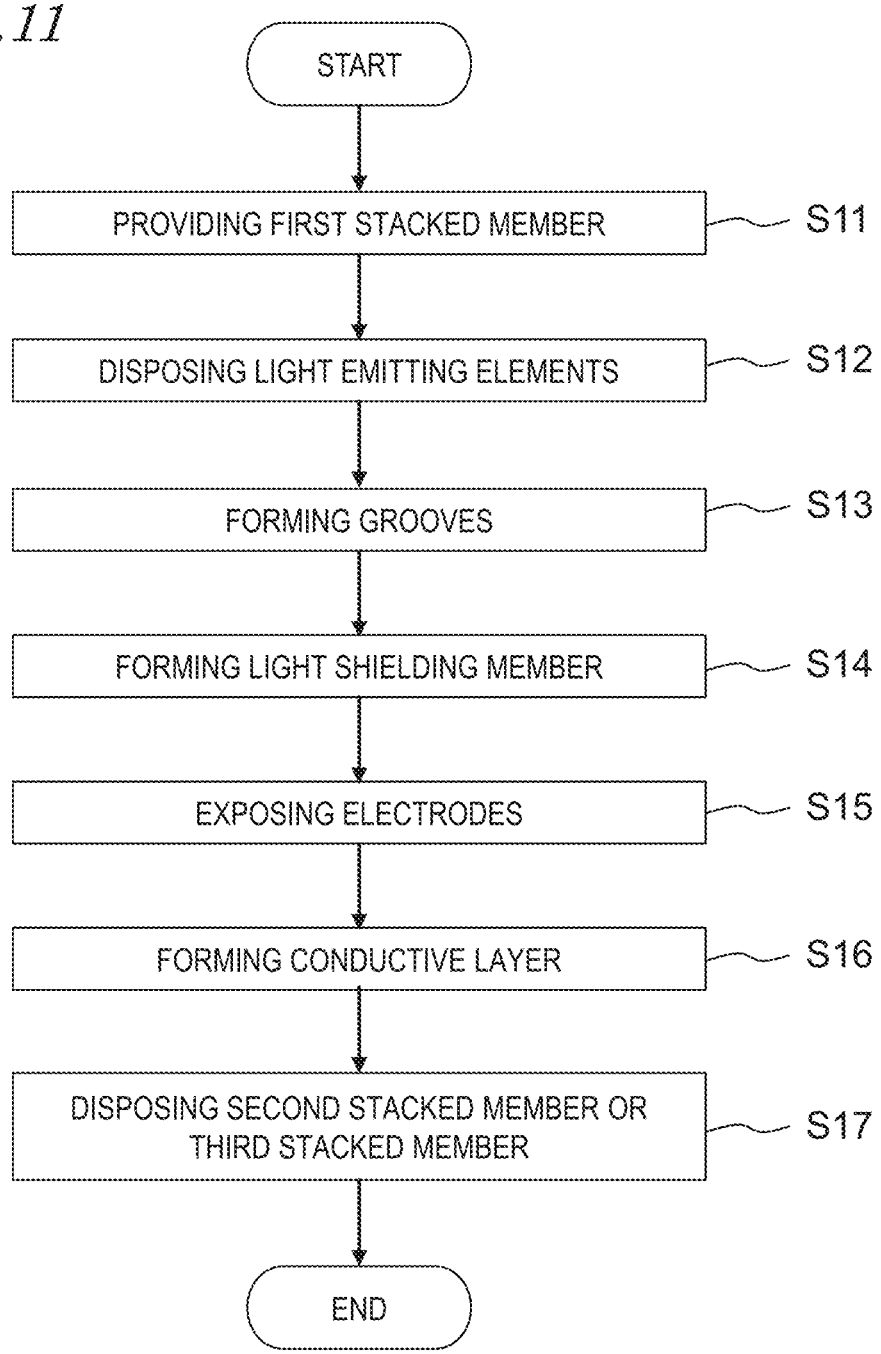
FIG. 11 is a flowchart of another method of manufacturing a light source according to the first embodiment.

A method of manufacturing a light source 101 according to another embodiment will be explained. FIG. 11 is a flowchart showing an example of the method of manufacturing a light source 101, and FIGS. 12A to 12K are cross-sectional views each showing a process in the method of manufacturing a light source 101. The method of manufacturing a light source 101 according to this embodiment includes a first stacked member provision step (S11), a light emitting element disposing step (S12), a groove forming step (S13), a light shielding member forming step (S14), an electrode exposing step (S15), a conductive layer forming step (S16), and a second stacked member or third stacked member disposing step (S17).

First Stacked Member Provision Step (S11)

Figure 12A:
FIG. 12A is a cross-sectional view of a process in the method of manufacturing a light source according to the first embodiment.

As shown in FIG. 12A, a first stacked member 91, which includes a first light diffusing member 41 disposed on a support 95 and a wavelength conversion member 30 disposed on the first light diffusing member 41, is provided. Specifically, a first light diffusing member 41 is temporarily fixed to the upper surface 95a of a support 95 by using a releasable adhesive member. Then a wavelength conversion member 30 is disposed on the first light diffusing member 41.

Light Emitting Element Disposing Step (S12)

Figure 12B:
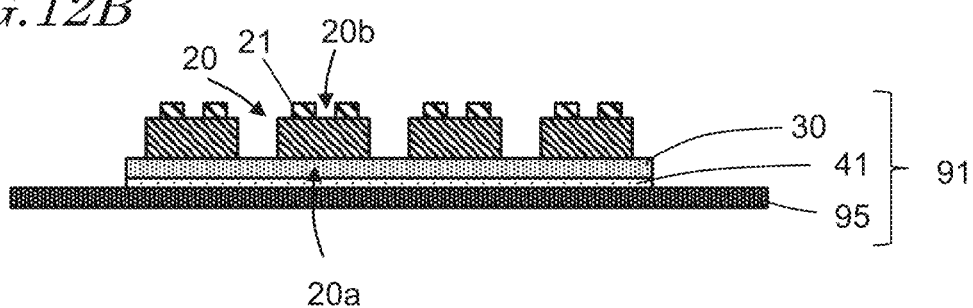
FIG. 12B is a cross-sectional view of a process in the method of manufacturing a light source according to the first embodiment.

As shown in FIG. 12B, on the wavelength conversion member 30 of the first stacked member 91, light emitting elements 20 each having a light emission surface 20a and an electrode surface 20b positioned opposite the light emission surface 20a are one-dimensionally or two-dimensionally arranged such that the light emission surfaces 20a oppose the wavelength conversion member 30. This can be accomplished in a similar manner as for the light emitting element disposing step (S2) described earlier.

Groove Forming Step (S13)

Figure 12C:
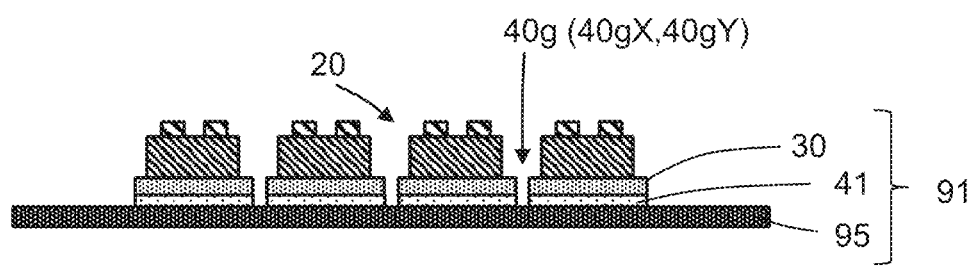
FIG. 12C is a cross-sectional view of a process in the method of manufacturing a light source according to the first embodiment.

As shown in FIG. 12C, grooves 40g that divide the wavelength conversion member 30 and the first light diffusing member 41 between two adjacent light emitting elements 20 are formed in the first stacked member 91. The grooves 40g are formed to reach the support 95 such that the wavelength conversion member 30 and the first light diffusing member 41 are divided between two adjacent light emitting elements 20. This disposes a wavelength conversion member 30 and a first light diffusing member 41 on each light emitting element 20. The lateral surfaces of both the wavelength conversion members 30 and the first light diffusing members 41 are exposed along the lateral surfaces of the grooves 40g.

Light Shielding Member Forming Step (S14)

Figure 12D:
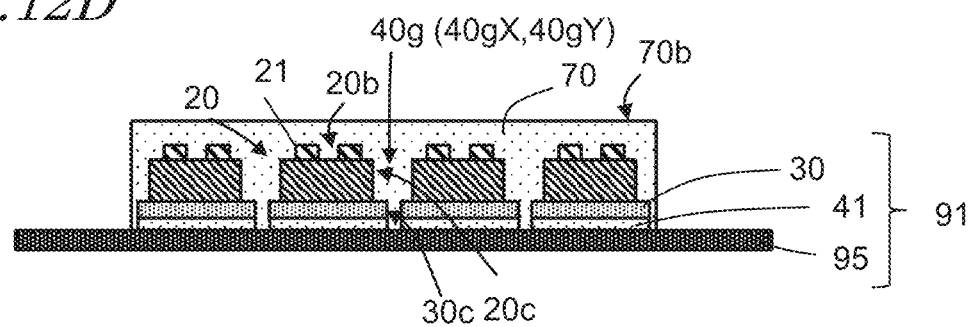
FIG. 12D is a cross-sectional view of a process in the method of manufacturing a light source according to the first embodiment.

As shown in FIG. 12D, a light shielding member 70 that fills the grooves 40g and covers the lateral surfaces 20c and the electrode surfaces 20b of the light emitting elements 20 is formed. This process can be performed in a similar manner as for the light shielding member forming step (S4) described earlier.

Electrode Exposing Step (S15)

Figure 12E:
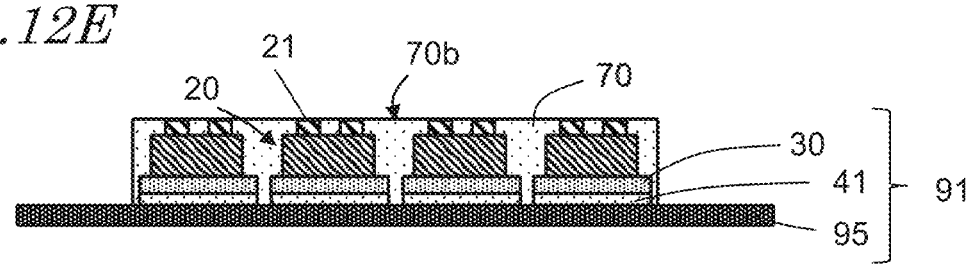
FIG. 12E is a cross-sectional view of a process in the method of manufacturing a light source according to the first embodiment.

As shown in FIG. 12E, the light shielding member 70 is ground to expose the positive and negative electrodes 21 on the electrode surfaces 20b of the light emitting elements 20. This process can be performed in a similar manner as for the electrode exposing step (S5) described earlier.

Conductive Layer Forming Step (S16)

Figure 12F:
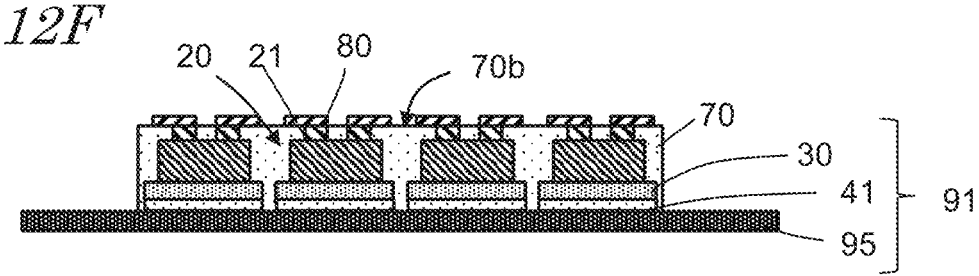
FIG. 12F is a cross-sectional view of a process in the method of manufacturing a light source according to the first embodiment.

As shown in FIG. 12F, a conductive layer 80 that covers the exposed positive and negative electrodes 21 is formed on the upper surface 70b of the light shielding member 70. This process can be performed in a similar manner as for the conductive layer forming step (S6) described earlier. This produces a composite structure 96 supported by the support 95.

Second Stacked Member or Third Stacked Member Disposing Step (S17)

Figure 12G:
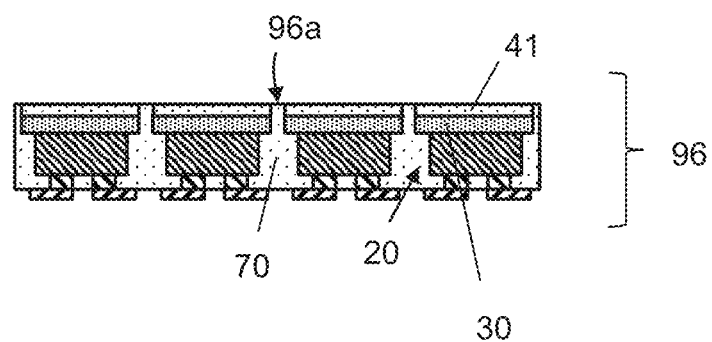
FIG. 12G is a cross-sectional view of a process in the method of manufacturing a light source according to the first embodiment.
Figure 12H:
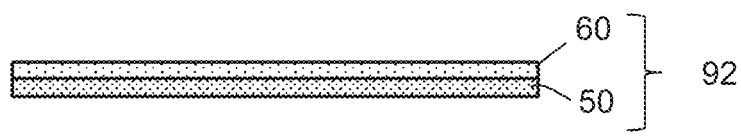
FIG. 12H is a cross-sectional view of a process in the method of manufacturing a light source according to the first embodiment.
Figure 12I:
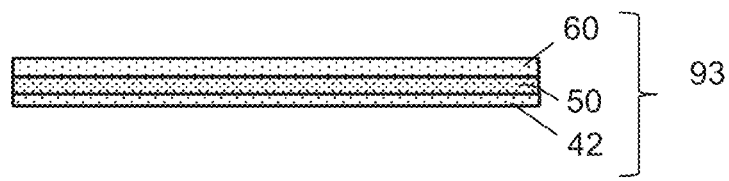
FIG. 12I is a cross-sectional view of a process in the method of manufacturing a light source according to the first embodiment.

As shown in FIG. 12G, the composite structure 96 is detached from the support 95. Separately, a second stacked member 92 in which a second light diffusing member 60 is stacked on a light transmitting member 50 such as that shown in FIG. 12H is prepared. Alternatively, a third stacked member 93 which includes an additional first light diffusing member 42, a light transmissive member 50 disposed on the additional first diffusing member 42, and a second light diffusing member 60 disposed on the light transmissive member 50 such as that shown in FIG. 12I is prepared. The second stacked member 92 or the third stacked member 93 is disposed on the first light diffusing member 41 such that the light transmitting member 50 of the second stacked member or the additional first light diffusing member 42 of the third stacked member opposes the first light diffusing member 41.

Specifically, the composite structure 96 is detached from the support 95 such that the first light diffusing member 41 is exposed at the upper surface 96a of the composite structure 96. Then a second stacked member 92 in which a second light diffusing member 60 is stacked on a light transmitting member 50 is separately provided. Alternatively, a third stacked member 93 which includes an additional first light diffusing member 42, a light transmitting member 50 disposed on the additional first light diffusing member 42, and a second light diffusing member 60 disposed on the light transmitting member 50 is provided. The second stacked member 92 or the third stacked member 93 can be formed in a similar manner as for the stacked member provision step (S1) described earlier.

Then either the second stacked member 92 or the third stacked member 93 is bonded to the upper surface 96a, the exposed first light diffusing member 41, of the composite structure 96. Using an adhesive or adhesive sheet, the light transmitting member 50 of the second stacked member 92 or the additional first light diffusing member 42 of the third stacked member 93 is bonded to the upper surface 96a of the composite structure 96. In this manner, a light source 101 shown in FIG. 12J or a light source 101 shown in FIG. 12K can be obtained.

Figure 12J:
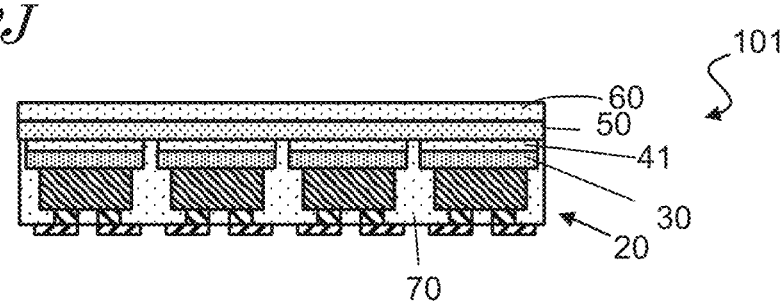
FIG. 12J is a cross-sectional view of a process in the method of manufacturing a light source according to the first embodiment.

The light source 101 shown n FIG. 12J has a plurality of first light diffusing members 41 divided to individually correspond to the light emitting elements 20. In this manner, a plurality of first light diffusing members 41 individually disposed on a plurality of wavelength conversion members 30 can be obtained. The light transmitting member 50 is disposed on the first light diffusing members 41, continuously covering the first light diffusing members 41.

Figure 12K:
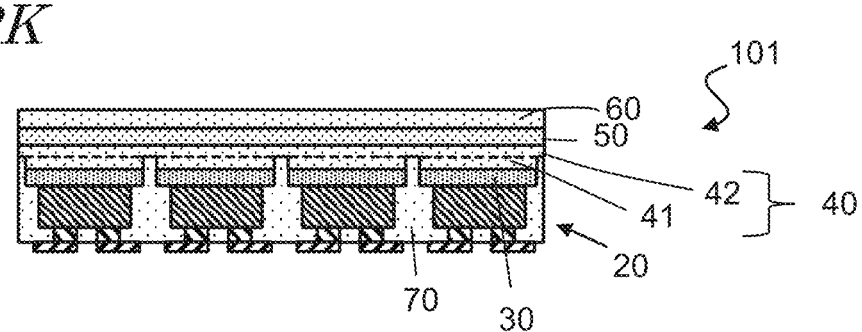
FIG. 12K is a cross-sectional view of a process in the method of manufacturing a light source according to the first embodiment.

The light source 101 shown n FIG. 12K has a plurality of first light diffusing members 41 divided to individually correspond to the light emitting elements 20 and an additional first light diffusing member 42 continuously covering the plurality of first light diffusing members 41. In this manner, a first light diffusing member 40 disposed on the wavelength conversion members 30, continuously covering the upper surfaces of the wavelength conversion members 30, and having grooves between the regions in the lower surface of the first light diffusing member positioned on the wavelength conversion member side that are in contact with the wavelength conversion members can be obtained. The light transmitting member 50 is disposed on the additional first light diffusing member 42, continuously covering the plurality of first light diffusing members 41.

Second Embodiment

Figure 13:
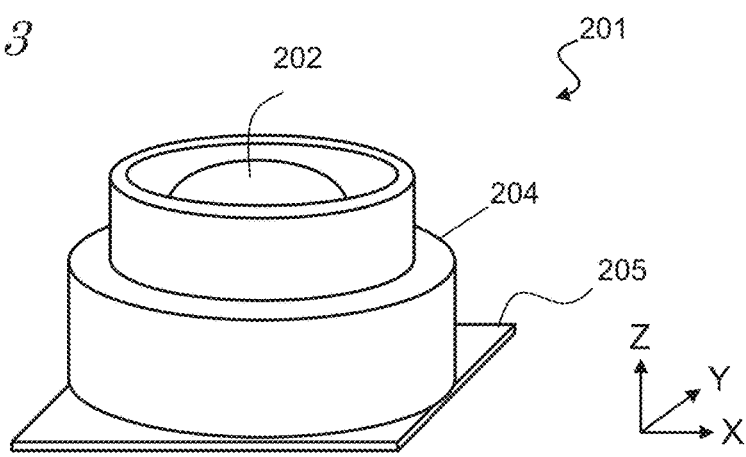
FIG. 13 is a schematic perspective view of a light source device according to a second embodiment.
Figure 14:
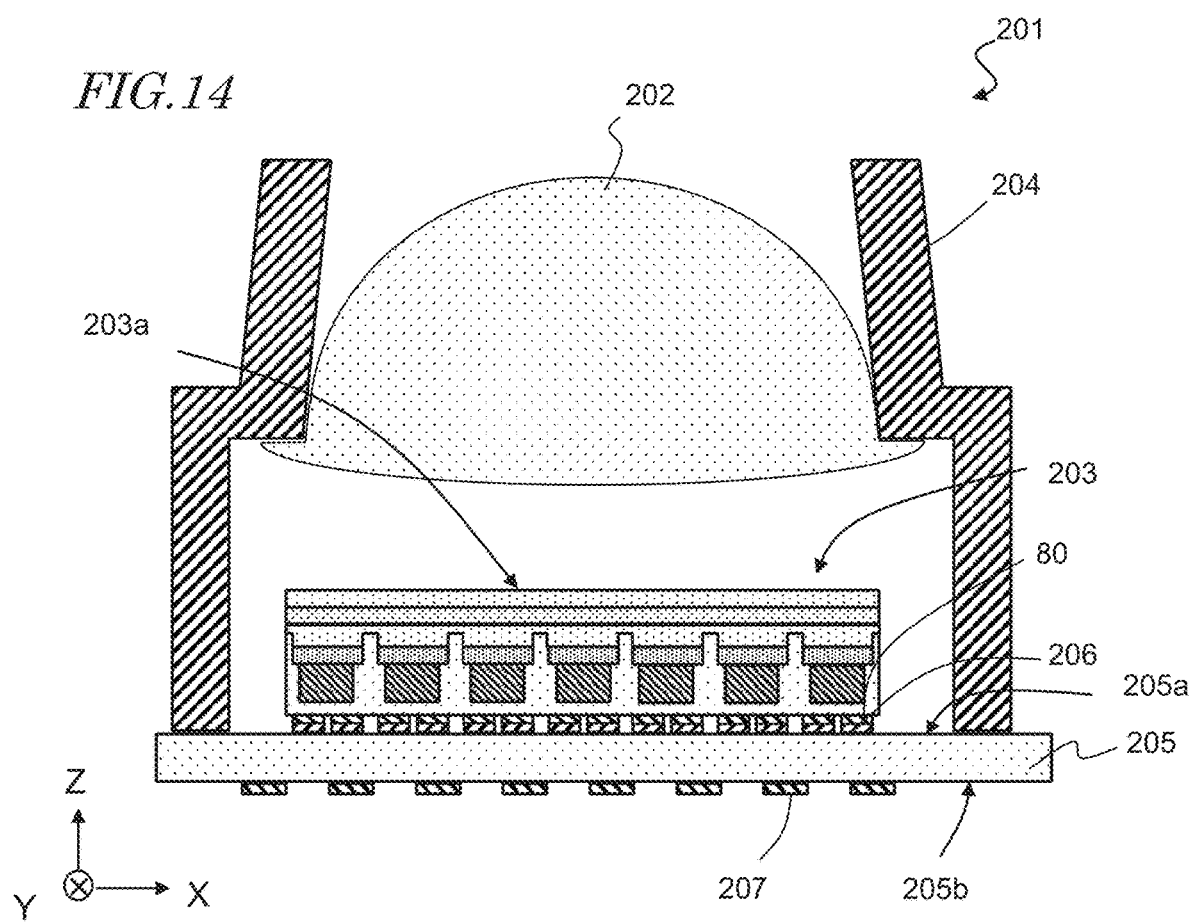
FIG. 14 is a schematic cross-sectional view of the light source device according to the second embodiment.
Figure 15:
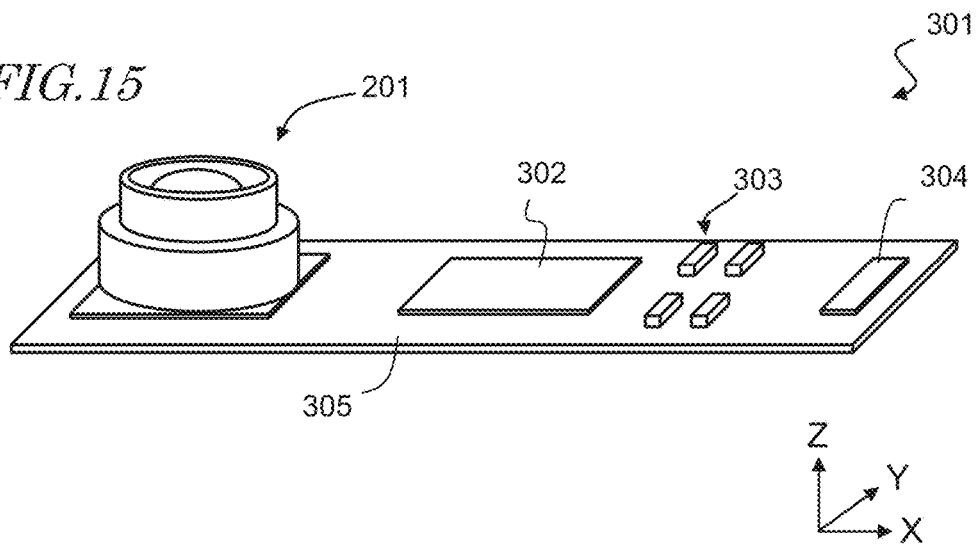
FIG. 15 is a schematic perspective view of a light source module according to the second embodiment.

Certain embodiments of a light source device and a light source module will be explained. FIG. 13 is a schematic perspective view of a light source device 201, and FIG. 14 is a schematic cross-sectional view of the light source device 201. FIG. 15 is a schematic perspective view of a light source module 301.

The light source device 201 includes a lens 202 and a light source 203. In this embodiment, the light source device 201 further includes a substrate 205 and a casing 204. For the light source 203, the light source 101 explained in the embodiment described earlier can be used. For example, the light source 203 is disposed on the substrate 205. The substrate 205 has an upper surface 205a and a lower surface 205b. Electrodes 206 are formed on the upper surface 205a and electrodes 207 are formed on the lower surface 205b. The electrodes 206 and the electrodes 207 are electrically connected using the conductive vias formed in the substrate 205. The light source 203 is supported by the upper surface 205a of the substrate 205 and the conductive layer 80 of the light source 203 is electrically connected to the electrodes 206.

The casing 204 holds the lens 202 at a prescribed distance from the upper surface 203a, the light emission surface, of the light source 203. The lens 202 is, for example, a convex lens, and the optical axis of the lens 202 is aligned with the center of the upper surface 203a.

The light source module 301 includes a driver IC 302, a passive element 303 such as a condenser, a connector 304, a circuit board 305, and a light source device 201. A circuit pattern is formed on the upper surface of the circuit board 305, on which the light source device 201, the driver IC 302, the passive element 303, and the connector 304 are mounted. The driver IC 302 and the passive element 303 may be mounted on the substrate 205 of the light source device instead of the circuit board 305.

The driver IC 302 and the passive element 303 configure the drive circuit for the light source 203. Electric current for driving the drive circuit and the light source device 201 is externally supplied to the connector 304. A control signal for selectively driving the light emission units 10 of the light source 203 is input.

The lens 202 is a projection type optical system that widely projects the outgoing light from the light source 203. When multiple light emission units 10 are partially driven, the light having the intensity and the irradiated area corresponding to the light intensity or turning ON/OFF effected by the partial driving is projected from the lens 202. The projected light can show that the light source module has good emission characteristics during partial irradiation as described with reference to the first embodiment.

In this embodiment, because the light source 203 includes, for example, 63 light emission units arranged in seven rows and nine columns, the projected light is also produced in the 7 rows by 9 columns range by independently lighting/blinking the light emission units, and adjusting the intensity during lighting.

Figure 16:
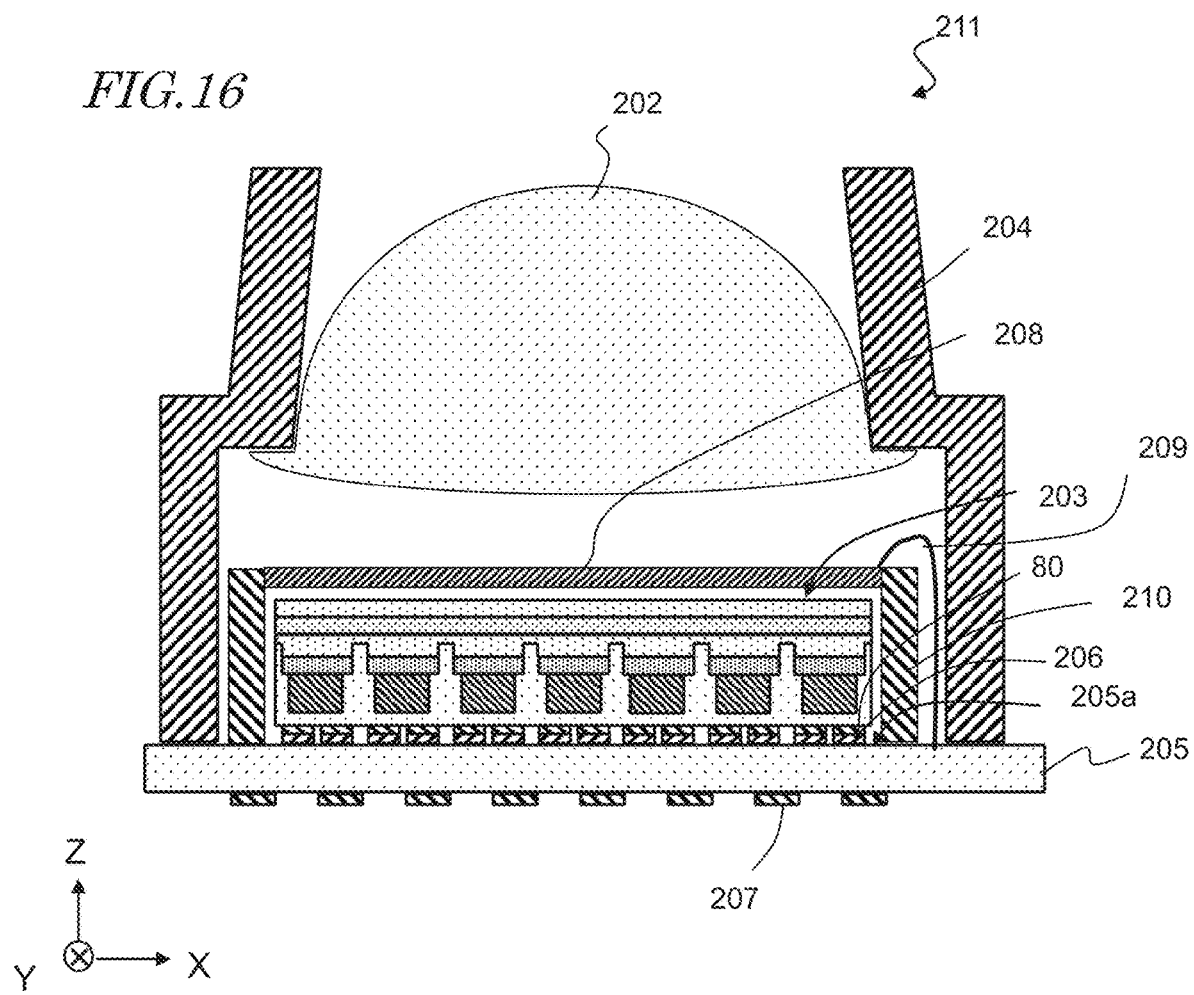
FIG. 16 is a schematic cross-sectional view of another light source device according to the second embodiment.
Figure 17:
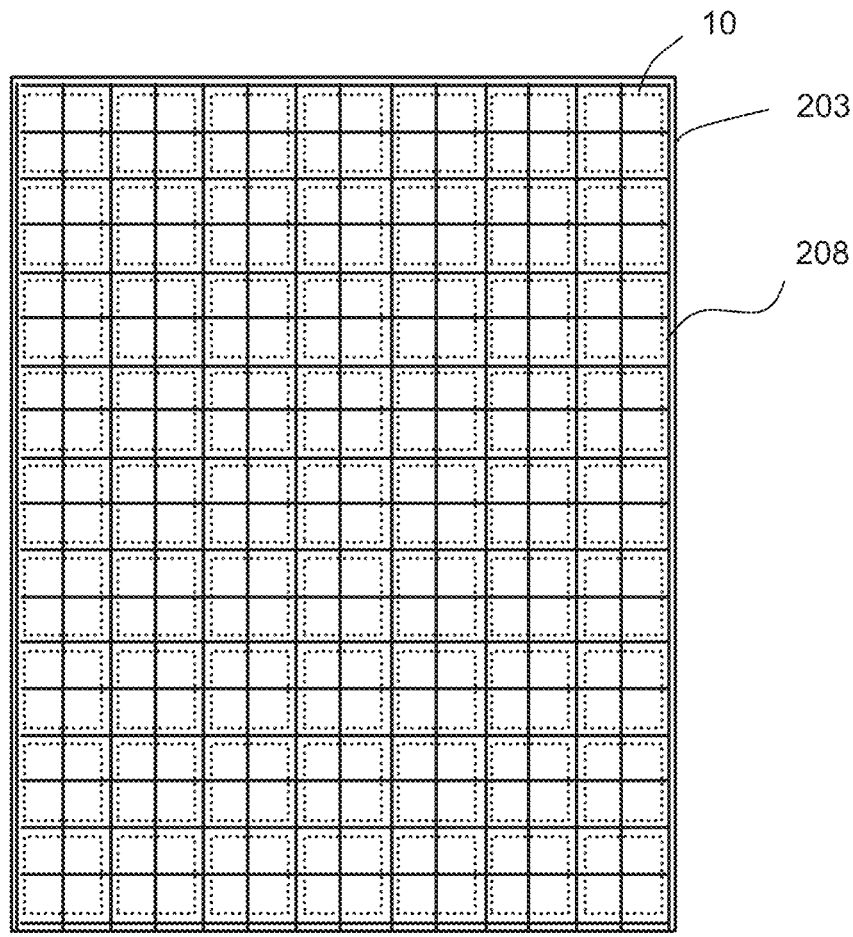
FIG. 17 is a schematic top view of a liquid crystal shutter.
Figure 18:
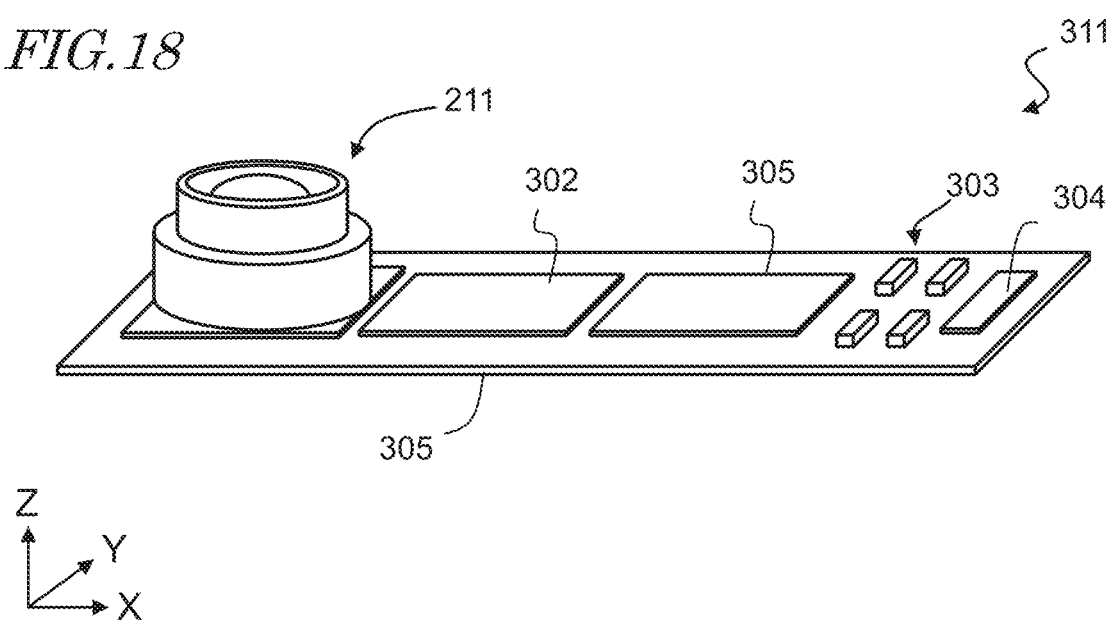
FIG. 18 is a schematic perspective view of another light source module according to the second embodiment.

In the case of performing ON/OFF control by using a smaller region as a unit than that defined by the arrangement pitch of the light emission units 10, for example, a liquid crystal shutter may be combined with the light source device 201. FIG. 16 is a schematic cross-sectional view of a light source device 211 which includes a liquid crystal shutter. FIG. 17 is a schematic plan view of the liquid crystal shutter 208 explaining the units of control. FIG. 18 is a schematic perspective view of a light source module 311 which includes a light source device 211.

As shown in FIG. 16, the light source device 211 includes a liquid crystal shutter 208, a support member 210 which holds the liquid crystal shutter 208 above the upper surface 203a of the light source 203, and wiring 209 which electrically connects the liquid crystal shutter 208 and the substrate 205. For example, the liquid crystal shutter 208 can perform independent ON/OFF control of four regions per light emission unit 10 as shown in FIG. 17. In other words, the liquid crystal shutter 208, for example, can perform ON/OFF control in units of regions arranged in 14 rows and 18 columns. The liquid crystal shutter transmits light in an ON state region, and blocks light in an OFF state region. The light source module 311 further includes a driver IC 305 that drives the liquid crystal shutter 208 in addition to the constituents of the light source module 301. In this embodiment, the driver IC 305 is mounted on the circuit board 305 of the light source module 311, but the driver IC 305 may be mounted on the substrate 205 of the light source device 211.

The light source module 311 can independently control lighting/blinking of 255 regions, 14 rows by 18 columns, which are smaller units than the light emission units 10. In the case of producing a light source module which has smaller sized light emission units 10 in order to reduce the lighting/blinking regions, a relatively larger number of regions between the light emission units 10 results, which can reduce the overall amount of the outgoing light from the light source 203. In such a case, incorporating a liquid crystal shutter allows for lighting/blinking control using smaller regions as units of control without reducing the overall amount of light.

EXAMPLE

A light source according to an embodiment was produced and the luminance distribution and the chromaticity distribution of the outgoing light from the light source were measured. As an example, the luminance and the chromaticity of the light source 101, in which light emission units 10 are arranged in 7 rows and 9 columns were measured. As a comparative example, the luminance and the chromaticity of a light source which did not have a second light diffusing member, a light transmitting member, and grooves 40g in the first light diffusing member were measured.

Figure 19A:
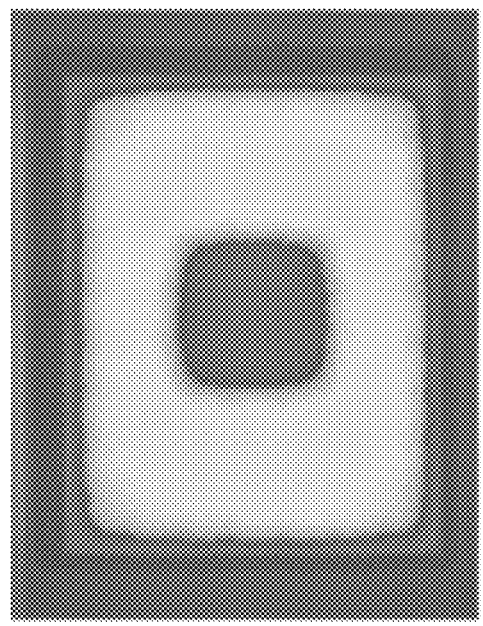
FIG. 19A shows the result of the luminance distribution of a light source in an example.
Figure 19B:
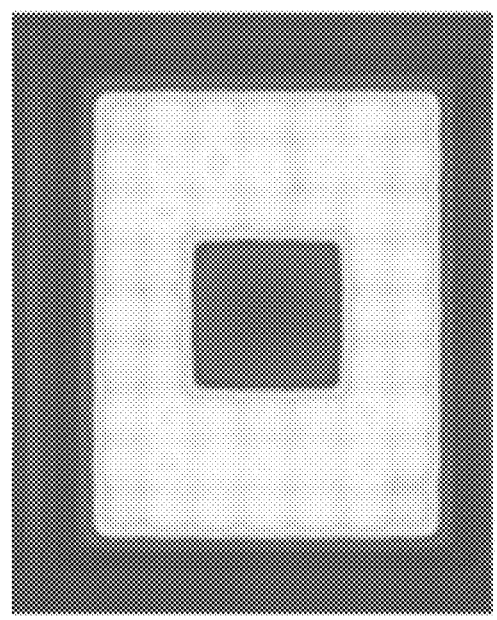
FIG. 19B shows the result of the luminance distribution of a light source in a comparative example.
Figure 20A:
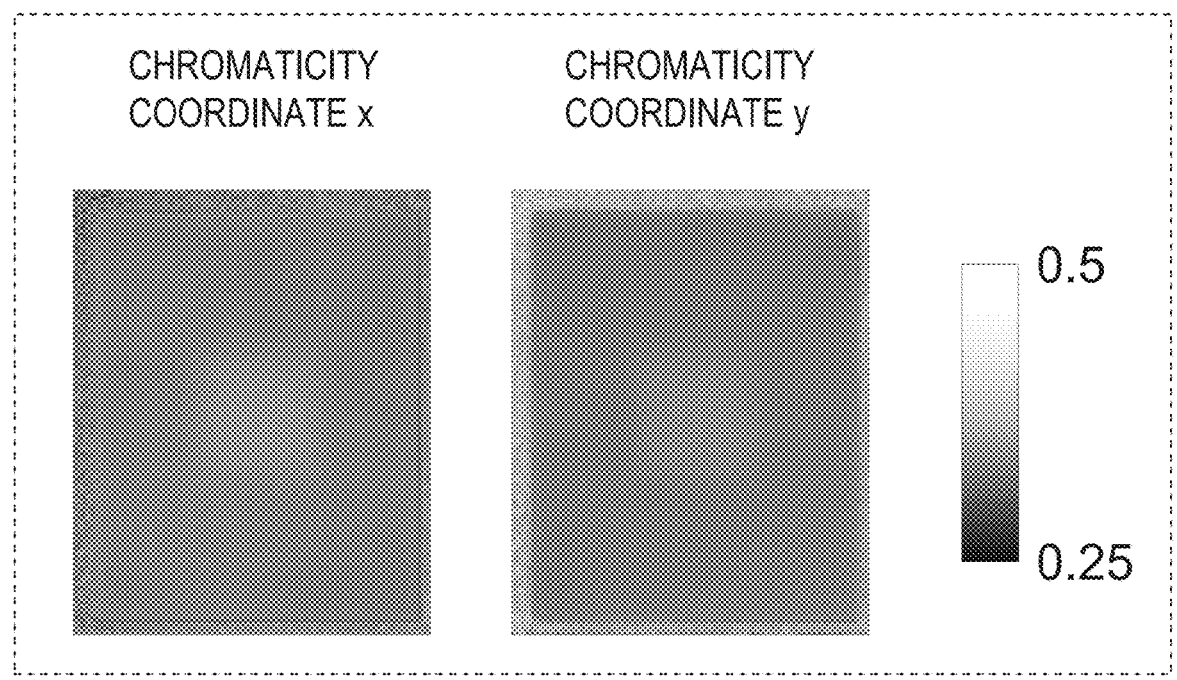
FIG. 20A shows the results of the chromaticity distribution of the light source in the example.
Figure 20B:
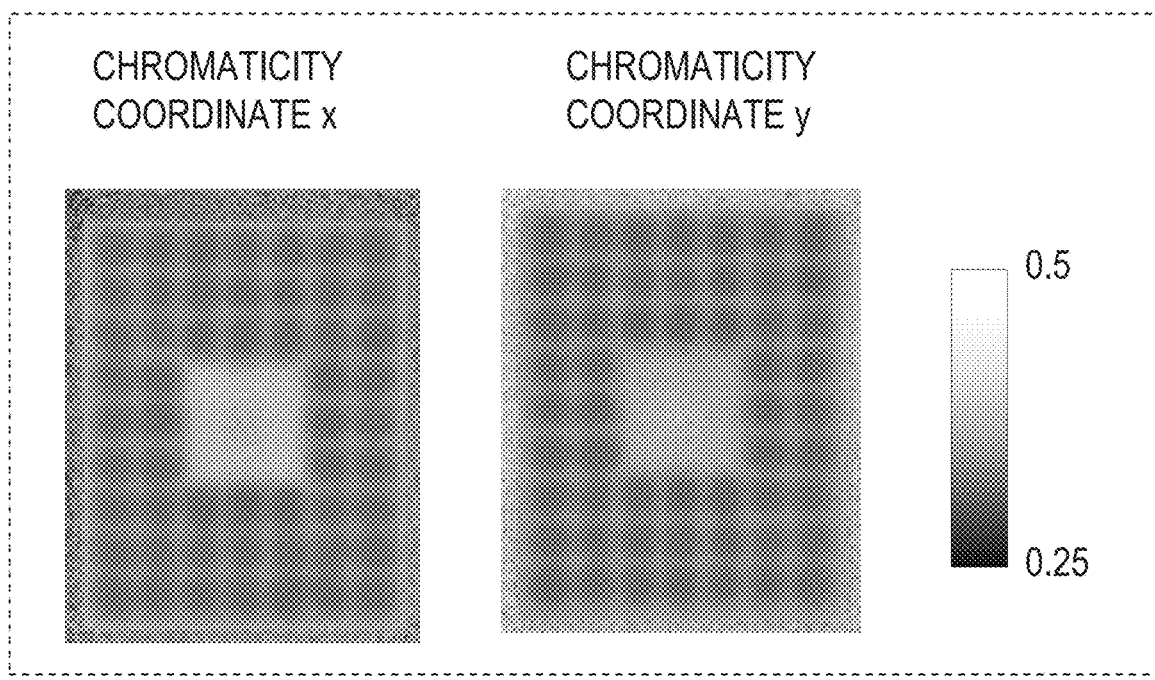
FIG. 20B shows the results of the chromaticity distribution of the light source in the comparative example.

FIG. 19A shows the luminance distribution of the light source of the example, and FIG. 19B shows the luminance distribution of the light source of the comparative example. FIG. 20A shows the chromaticity distribution of the light source of the example, and FIG. 20B shows the chromaticity distribution of the light source of the comparative example. In order to evaluate the luminance and the chromaticity in the region between two lit light emission units, and in the region between a lit light emission unit and an unlit light emission unit, the nine light emission units in the center were not lit while the surrounding 54 light emission units were lit in both of the light source 101 of the example and the light source of the comparative example.

In the light source 101 of the example, the distance between two adjacent wavelength conversion members 30 was 50 μm, whereas in the light source of the comparative example, the distance between two adjacent wavelength conversion members 30 was 25 μm. The thickness of both the first light diffusing member and the second light diffusing member was 60 μm, and the thickness of the light transmitting member was 100 μm. The total transmittance and the diffusion rate were 58% and 57%, respectively, for both the first light diffusing member and the second light diffusing member.

In FIG. 19A and FIG. 19B, the luminance is shown as grayscale images, in which the whiter the region, the higher the luminance resulted. As is understood from FIG. 19A and FIG. 19B, almost no regions with reduced luminance can be seen between the lit light emission units surrounding the unlit units in the example, but regions with reduced luminance can be recognized between the lit emission units in the comparative example.

In each of FIG. 20A and FIG. 20B, the diagram on the left shows the distribution of the chromaticity coordinate x values in the xy chromaticity diagram, and the diagram on the right shows the distribution of the chromaticity coordinate y values. The bar furthest on the right in each figure shows the chromaticity coordinates x and y values in the grayscale range of from 0.25 to 0.5. The colors shown in the distribution diagrams for the chromaticity coordinates x and y correspond to the values in the bars (shades ranging from white to black). As is understood from FIG. 20A, in the case of the example, both the x and y chromaticity values hardly changed in the regions between the lit light emission units which surround the unlit units. In contrast, in the comparative example, there are regions in which the x and y values are high between the lit light emission units. In other words, it is understood that, in the example, there is almost no chromaticity deviation even in the regions between the lit light emission units, whereas in the comparative example, the chromaticity is shifted towards yellow in the regions between the lit light emission units. It is understood that, in the example, the color non-uniformity is improved in the unlit regions.

Figure 21A:
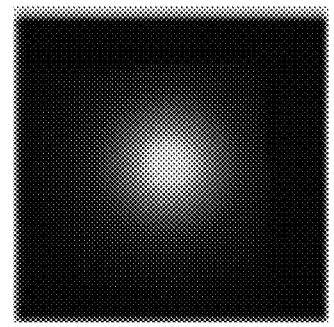
FIG. 21A is a photograph showing the emission state when one of the light emission units is turned on in the light source in the example.
Figure 21B:
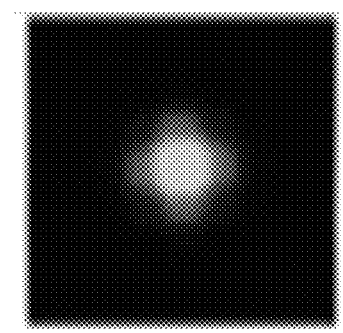
FIG. 21B is a photograph showing the emission state when one of the light emission units is turned on in the light source in the comparative example.

FIG. 21A and FIG. 21B respectively show the appearance of the light source 101 of the example and the appearance of the light source in the comparative example when one light emission unit was lit. In the case of the light source 101 of the example, light annularly spreads weakly around the lit light emission unit, whereas in the case of the light source of the comparative example, relatively high intensity light spreads vertically and horizontally. As such, the spreading of light into unlit light emission units is more intense in the case of the light source of the comparative example. In other words, in the light source 101 of the example, the luminance difference (contrast) is improved between the emission region and the non-emission region as a result of the reduced leakage of light into the non-emission region.

As described above, according to this example, a light source having excellent emission characteristics during partial irradiation, such as reduced dark lines or chromaticity deviations in the regions between the emission regions and the non-emission regions, can be achieved.

A light source and a light source device according to the present invention can be used as a light emitting device in a wide range of uses and purposes, such as a camera flash, automotive headlight, illumination, and the like. They can be suitably employed as light emitting devices for light fixtures of various uses and purposes, for example.

What is claimed is:

1. A light source device comprising:
   a substrate;
   a light source supported by the substrate, the light source including a plurality of light emission units two-dimensionally arranged;
   a liquid crystal shutter disposed on the light source; and
   a lens disposed on the liquid crystal shutter, wherein
   the liquid crystal shutter is configured to perform independent ON/OFF control in two or more regions corresponding to at least one of the light emission units.

2. The light source device according to claim 1, wherein the light emission units include
   a plurality of light emitting elements each having a light emission surface and an electrode surface that is opposite to the light emission surface, and
   a plurality of wavelength conversion members each disposed on the light emission surface of a respective one of the light emitting elements.

3. The light source device according to claim 2, wherein the light emission units further include one or more first light diffusing members disposed on the wavelength conversion members.

4. The light source device according to claim 3, wherein the light emission units further include
   a light transmitting member disposed on the one or more first light diffusing members, and
   a second light diffusing member disposed on the light transmitting member.

5. The light source device according to claim 2, wherein the light emission units further include a light shielding member covering lateral surfaces of the light emitting elements and lateral surfaces of the wavelength conversion members.

6. The light source device according to claim 3, wherein the one or more first light diffusing members is a first light diffusing member disposed over the wavelength conversion members, continuously covering upper surfaces of the wavelength conversion members, and defining a plurality of grooves each arranged between adjacent ones of regions in a lower surface of the first light diffusing member that are in contact with the wavelength conversion members.

7. The light source device according to claim 3, wherein the one or more first light diffusing members include a plurality of first light diffusing members each disposed on a respective one of the wavelength conversion members.

8. The light source device according to claim 4, wherein the light transmitting member is a glass sheet.

9. The light source device according to claim 4, wherein a total transmittance of the one or more first light diffusing members and the second light diffusing member is 30% or higher, and 90% or lower.

10. The light source device according to claim 1, further comprising
a casing holding the lens, wherein
the light source and the liquid crystal shutter are disposed in the casing.

11. The light source device according to claim 1, wherein the light source is configured to emit white light.

12. The light source device according to claim 1, wherein the lens is a convex lens.

13. A light source module comprising:
the light source device according to claim 1;
a circuit board on which the light source device is mounted; and
a driver IC and a passive element that constitute a drive circuit for the light source of the light source device, the driver IC and the passive element being mounted on the circuit board.

* * * * *